United States Patent
Aruga et al.

(10) Patent No.: US 9,644,250 B2
(45) Date of Patent: *May 9, 2017

(54) COPPER ALLOY SHEET FOR ELECTRIC AND ELECTRONIC PART

(75) Inventors: Yasuhiro Aruga, Kobe (JP); Ryoichi Ozaki, Shimonoseki (JP); Yosuke Miwa, Shimonoseki (JP)

(73) Assignee: KOBE STEEL, LTD., Kobe-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/585,076

(22) Filed: Aug. 14, 2012

(65) Prior Publication Data

US 2012/0308429 A1    Dec. 6, 2012

Related U.S. Application Data

(63) Continuation of application No. 12/374,154, filed as application No. PCT/JP2007/062395 on Jun. 20, 2007.

(30) Foreign Application Priority Data

Jul. 21, 2006 (JP) .................. 2006-199777
Jul. 21, 2006 (JP) .................. 2006-199778
(Continued)

(51) Int. Cl.
  *C22C 9/00* (2006.01)
  *C22C 9/02* (2006.01)
  (Continued)

(52) U.S. Cl.
  CPC .................. *C22C 9/00* (2013.01); *C22C 9/02* (2013.01); *C22C 9/04* (2013.01); *C22F 1/00* (2013.01);
  (Continued)

(58) Field of Classification Search
  CPC .................. C22C 9/00; C22C 9/02; C22C 9/04
  (Continued)

(56) References Cited

U.S. PATENT DOCUMENTS 5,980,656 A    11/1999   Brenneman et al.
6,149,741 A    11/2000   Durand-Texte
(Continued)

FOREIGN PATENT DOCUMENTS

CN    1743481 A    3/2006
EP    1 803 829 A1    7/2007
(Continued)

OTHER PUBLICATIONS

Machine translation of JP 2002275563, 2002.*
(Continued)

*Primary Examiner* — Rebecca Lee
(74) *Attorney, Agent, or Firm* — Oblon, McClelland, Maier & Neustadt, L.L.P.

(57) ABSTRACT

A shear plane ratio is reduced by a dislocation density in which a value obtained by dividing the half-value width β of the intensity of diffraction of {311} plane in the surface of a Cu—Fe—P alloy sheet, by its peak height H, is 0.015 or more. In addition, a Cu—Fe—P alloy sheet with relatively small Fe content is provided with a texture in which a ratio (I(200)/I(220)) of intensity of diffraction of (I(200)) from the (200) plane in the sheet surface to intensity of diffraction of (I(220)) from the (220) plane, is 0.3 or less. In addition, a Cu—Fe—P alloy sheet with relatively small Fe content is provided with a texture in which the orientation distribution density of Brass orientation measured by the crystal orientation analysis method using an EBSP by an FE-SEM, is 25% or more; and an average grain size in the sheet is 6.0 μm or less.

20 Claims, 1 Drawing Sheet

(30) Foreign Application Priority Data

Jul. 21, 2006 (JP) ................................. 2006-199779
May 15, 2007 (JP) ................................. 2007-129468

(51) Int. Cl.
  *C22C 9/04* (2006.01)
  *C22F 1/00* (2006.01)
  *C22F 1/08* (2006.01)
  *H05K 1/09* (2006.01)

(52) U.S. Cl.
  CPC ................. *C22F 1/08* (2013.01); *H05K 1/09* (2013.01); *H01L 2924/0002* (2013.01); *H05K 2201/0355* (2013.01)

(58) Field of Classification Search
  USPC ......................................... 420/471, 472, 496
  See application file for complete search history.

(56) References Cited

U.S. PATENT DOCUMENTS

| | | | |
|---|---|---|---|
| 8,063,471 | B2 | 11/2011 | Aruga et al. |
| 2005/0092404 | A1 | 5/2005 | Aruga et al. |
| 2005/0161126 | A1 | 7/2005 | Aruga et al. |
| 2006/0045790 | A1 | 3/2006 | Hatakeyama |
| 2006/0137773 | A1 | 6/2006 | Aruga et al. |
| 2007/0148032 | A1 | 6/2007 | Aruga et al. |
| 2008/0025867 | A1 | 1/2008 | Aruga et al. |
| 2009/0010797 | A1 | 1/2009 | Aruga et al. |
| 2012/0039741 | A1 | 2/2012 | Aruga et al. |
| 2012/0039742 | A1 | 2/2012 | Aruga et al. |
| 2012/0039743 | A1 | 2/2012 | Aruga et al. |

FOREIGN PATENT DOCUMENTS

| | | |
|---|---|---|
| JP | 57-2849 | 1/1982 |
| JP | 62 99430 | 5/1987 |
| JP | 02-122035 | 5/1990 |
| JP | 6 184678 | 7/1994 |
| JP | 09-209061 | 8/1997 |
| JP | 2000 328157 | 11/2000 |
| JP | 2000-328157 | 11/2000 |
| JP | 2000 328158 | 11/2000 |
| JP | 2000 328159 | 11/2000 |
| JP | 2003-328158 | 11/2000 |
| JP | 2001-244400 | 9/2001 |
| JP | 2001 244400 | 9/2001 |
| JP | 2002275563 A * | 9/2002 ............... C22C 9/02 |
| JP | 2002 339028 | 11/2002 |
| JP | 2003-34829 | 2/2003 |
| JP | 2003 96526 | 4/2003 |
| JP | 2004-91895 | 3/2004 |
| JP | 2004 91895 | 3/2004 |
| JP | 2005-29826 | 2/2005 |
| JP | 2005 139501 | 6/2005 |
| JP | 2006-37237 | 2/2006 |
| JP | 2006 37237 | 2/2006 |
| JP | 2006 63431 | 3/2006 |
| JP | 2006 83465 | 3/2006 |
| JP | 2006-83465 | 3/2006 |
| WO | 2006/019035 A1 | 2/2006 |
| WO | WO 2006/019035 | 2/2006 |

OTHER PUBLICATIONS

Machine translation of JP 2000328157, 2000.*
Chinese Office Action dated Jul. 14, 2011 issued in the corresponding Chinese Patent Application No. 201020363884.1, filed Jun. 20, 2007.
U.S. Appl. No. 13/681,747, filed Nov. 20, 2012, Ozaki.
U.S. Office Action in U.S. Appl. No. 12/374,154, dated Sep. 9, 2013.
European Search Report in Application No. 11000124.5 dated Jan. 3, 2014.
European Search Report in Application No. 11000125.2 dated Jan. 3, 2014.

* cited by examiner

β: HALF-VALUE WIDTH

COPPER ALLOY SHEET FOR ELECTRIC AND ELECTRONIC PART

CROSS REFERENCE TO RELATED APPLICATIONS

The present application is a continuing application based on the national stage of international application PCT/JP2007/062395, filed on Jun. 20, 2007, and claims the benefit of the filing dates of Japanese Applications No. 2006-199777, filed on Jul. 21, 2006; No. 2006-199778, filed on Jul. 21, 2006; No. 2006-199779, filed on Jul. 21, 2006; and No. 2007-129468, filed on May 15, 2007, the text of each of which is incorporated by reference.

FIELD OF THE INVENTION

The present invention relates to a Cu—Fe—P alloy sheet with a high strength and an excellent stampability in a stamping process.

The present invention also relates to a Cu—Fe—P alloy sheet with a high strength and a high softening resistance in which the strength thereof is less decreased when subjected to a heat treatment, such as a stress relief annealing.

The present invention also relates to a Cu—Fe—P alloy sheet with a high strength and an improved resistance of peel off of an oxidation film to prevent package cracks and peeling from occurring. The copper alloy sheet according to the present invention is suitable as a material used in lead frames for semiconductor devices, and also suitably used for various electric and electronic parts other than lead frames for semiconductor devices, such as other semiconductor parts, a material for electric and electronic parts, e.g., printed circuit boards, and mechanical parts, e.g., switching parts, bus bars, terminals, and connectors. However, the following description will be made centering on the case where the copper alloy sheet is used in lead frames, semiconductor parts, as a typical example of applications.

BACKGROUND OF THE INVENTION

Conventionally, a Cu—Fe—P alloy is generally used as a copper alloy for semiconductor lead frames. As these Cu—Fe—P alloys, for example, a copper alloy (C19210 alloy) containing Fe 0.05 to 0.15% and P 0.025 to 0.040%; and a copper alloy (CDA194 alloy) containing Fe 2.1 to 2.6%, P 0.015 to 0.15%, and Zn 0.05 to 0.20%, can be exemplified. When intermetallic compounds such as Fe and Fe—P are precipitated in the copper matrix phase, these Cu—Fe—P alloys are excellent in its strength, electric conductivity, and thermal conductivity among copper alloys; hence they are widely used as international standard alloys.

The recent advancement of the large-capacity, miniaturization, and high-performance of semiconductor devices used in electronic apparatuses has urged the growing reduction in the cross-sectional area of lead frames adopted in the semiconductor devices; thereby there is a demand for a higher strength, electric conductivity, and thermal conductivity. With the demand, there is also a demand for a higher strength and a higher thermal conductivity against a copper alloy sheet used in the semiconductor devices.

On the other hand, the copper alloy sheets provided with a high strength are also requested to have the workability to be formed into the lead frame with the reduced cross-sectional area. Specifically, a copper alloy sheet is subjected to a stamping process so as to be formed into a lead frame, hence, a copper alloy sheet is requested to have an excellent stampability. The request is also made when a copper alloy sheet is used for applications of being press-punched other than the application of the lead frames.

Conventionally, in order to improve a stampability of a Cu—Fe—P alloy sheet, the following measures have been widely used. The measures are as follows: control of chemical components in which trace additives, such as Pb and Ca, or a compound that could be a starting point of a break, are to be dispersed; or control of a grain size or the like.

However, these measures have problems in that the controls per se are difficult to be carried out, these controls adversely affect other properties, and a production cost is therefore increased.

Contrary to that, focusing attention on a microstructure of a Cu—Fe—P alloy sheet, it is proposed that a stampability and a bending workability thereof are improved. For example, Patent Document 1 discloses a Cu—Fe—P alloy sheet containing Fe 0.005 to 0.5 wt % and P 0.005 to 0.2 wt %, and further contains either one or both of Zn 0.01 to 10 wt % and Sn 0.01 to 5 wt %, if needed. According to Patent Document 1, a stampability is improved by controlling an integration degree of a crystal orientation of the copper alloy sheet (see Patent Document 1).

More specifically, in Patent Document 1, the integration degree is controlled by the use of the fact that: as the copper alloy sheet is recrystallized and its grain size becomes larger, the orientation density in the {200} plane and the {311} plane in the sheet surface are larger; and when the copper alloy sheet is rolled, the orientation density in the {220} plane is larger. Characteristically, Patent Document 1 is intended to improve the stampability by increasing the orientation density in the {220} plane in the sheet surface relative to the {220} plane and the {311} plane. More specifically, assuming that an intensity of X-ray diffraction of {200} plane in the sheet surface is I[200], that of {311} is plane I[311], and that of {220} plane is I[220], the document specifies that [I[200]+I[311]]/I[220]<0.4 should be satisfied.

Patent Document 2 proposes that, in order to improve a stampability, a ratio (I(200)/I(220)) of the intensity I(200) of X-ray diffraction of (200) plane in a copper alloy sheet to the intensity I(220) of X-ray diffraction of the (220) plane, should be 0.5 or more to 10 or less; or the orientation density of Cube orientation (D(Cube orientation)) should be 1 or more to 50 or less; or a ratio (D(Cube orientation)/D(S orientation)) of the orientation density of D orientation (D(Cube orientation)) to the orientation density of S orientation (D(S orientation)) should be 0.1 or more to 5 or less (see Patent Document 2).

Further, Patent Document 3 proposes that, in order to improve a bending workability of a Cu—Fe—P alloy sheet, a ratio ([I(200)+I(311)]/I(220)) of a total of the intensity of X-ray diffraction of the (200) plane and that of the (311) plane to the intensity of X-ray diffraction of the (220) plane, should be 0.4 or more (see Patent Document 3).

Further, Patent Document 4 proposes that, in order to improve a bending property of a Cu—Fe—P alloy sheet, I(200)/I(110) should be 1.5 or less (see Patent Document 4).

On the other hand, a Cu—Fe—P alloy sheet with a high strength is required to have a high (softening resistance such that it is hardly decreased in the strength even when subjected to a heat treatment, such as a stress relief annealing.

Generally, a lead frame having a plurality of pins is fabricated by subjecting a Cu—Fe—P alloy sheet to a stamping process (press punching process). As stated above, in a copper alloy sheet used as a material for electric and electronic parts, thinning of the copper alloy sheet and increase in the numbers of pins have progressively advanced in recent years to cope with the miniaturization, the thinning and weight reduction of the parts. With the advancement, residual stresses are liable to remain in such a lead frame after subjected to the stamping process and the pins thereof tends to be arranged irregularly. Therefore, a copper alloy sheet with a plurality of pins formed by the stamping process is usually subjected to a heat treatment (stress relief annealing) such that stresses are relieved.

However, when subjected to such a heat treatment, a material tends to be softened, and cannot maintain the mechanical strength before the treatment. In addition, from a viewpoint of improving productivity in production processes, the treatment is required to be performed at a higher temperature and in a shorter time, hence there is a strong demand for a softening resistance with which the material can maintain a high strength after subjected to a heat treatment at a higher temperature.

To cope with these problems, some measures have been taken so far in which alloy elements, such as Fe, P, and Zn, and other additive trace elements, such as Sn, Mg, and Ca, are to be contained, or additive amounts of these elements are adjusted. Controls of dispersoids and precipitates in a copper alloy sheet have also taken so far. However, only with such adjustments of elements or controls of dispersoids and precipitates, a copper alloy sheet cannot fully cope with the growing miniaturization and thinning of copper alloy parts or the desired softening resistance property, hence other techniques are further proposed in which microstructures or the like of a copper alloy sheet is controlled.

For example, a technique disclosed in Patent Document 5 increases a strength of a copper alloy, which is not a Cu—Fe—P alloy but used as a material and produced by adding a small amount of Ag in an oxygen free copper, by controlling a X-ray diffraction intensity ratio after the final rolling and controlling a grain size before the final rolling. That is, a copper alloy with a high strength is obtained by the following measures: after subjected to a hot-rolling, the copper alloy is subjected to a plurality of working cycles each of a cold-rolling and a recrystallization annealing; and a reduction ratio in the final rolling, an average grain size after subjected to the recrystallization annealing before the final cold-rolling, and a reduction ratio in the cold-rolling before the final annealing, are controlled such that the X-ray diffraction intensity ratio after the final rolling, and the grain size before the final rolling are controlled. However, even when applying the rolling and annealing conditions that the document recommends, to the Cu—Fe—P alloy targeted by the present invention, as they are, such a higher level of softening resistance as requested of the above stated lead frame or the like cannot be acquired (see Patent Document 5).

Contrary to that, various techniques for improving a softening resistance in a Cu—Fe—P alloy have been proposed. For example, a technique of Patent Document 6 proposes that a high softening resistance can be acquired by controlling forms per se of a dispersoid and a precipitate of a Cu—Fe—P alloy with a substantial Fe content of 0.7% or more, which is a large content. That is, a higher softening resistance can be acquired by the measures that a ratio (Xγ/Xα) of the X-ray peak area (Xγ) of the α-Fe crystallized substance contained in a microstructure, to the X-ray peak area (Xα) of the α-Fe crystallized substance contained therein, is 0.05 or more (see Patent Document 6).

A technique of Patent Document 7 proposes that, in order to acquire a higher softening resistance by controlling a texture, the orientation density of Cube orientation in a Cu—Fe—P alloy with a substantial Fe content of 0.5% or more, which is a large content, after subjecting the copper alloy to an annealing at 500° C. for 1 minute, should be 50% or less; and further an average grain size thereof should be 30 ml or less (see Patent Document 7).

A technique of Patent Document 2 discloses that a Cu—Fe—P alloy with a substantial Fe content of 2% or more, which is a large content, can be improved in its workability of the sheet and formability into a lead frame by controlling its texture, but not intended to improve its softening resistance. Herein, the workability means a corrugation, meandering and uneven residual stress of the sheet, in a cold-rolling; a slit streak; occurrence of a skew and burr in a stamping process; and a rough surface and crack in a lead bending processed portion. In addition, the texture means that the X-ray diffraction intensity ratio of the (200) plane and the (220) plane and the orientation density of Cube orientation, are properly controlled.

On the other hand, in the plastic packages for semiconductor devices, the package in which a semiconductor chip is encapsulated by a thermosetting resin is a mainstream, because the package is excellent in the economic efficiency and mass productivity. With the recent demands for miniaturization of electronic parts, the package becomes increasingly thinner.

When assembling the package, semiconductor chip is heated to be adhered to a lead frame by using an Ag paste, etc., or soldered or brazed with Ag via a plated layer made of AU or Ag or the like. After that, the package is generally encapsulated with a resin, subsequently an implementation is performed on an outer lead by an electroplating.

The most serious problem concerning the reliability of these packages is a package crack or peeling occurring upon the implementation. Peeling of a package occurs by a thermal stress generated in the subsequent heat treatment, when a resistance of peel off between a resin and a die pad (portion where a semiconductor chip of a lead frame is mounted) is deteriorated after assembling the semiconductor package.

Contrary to that, a package crack occurs through the following processes: after assembling a semiconductor package, a mold resin absorbs moisture from the air, and the moisture vaporizes by heating in the subsequent surface implementation. When a crack is present inside the package at the time, the moisture is applied to the peeled plane, which acts as an internal pressure. A swelling is caused in the package by the inner pressure, or a crack is caused when the resin is weak against the inner pressure. When a crack is caused in a package after the surface implementation, moistures and impurities are incursive therein to cause the chip to be corroded; hence impairing a function as a semiconductor. In addition, the swelling of a package results in a poor appearance and lost of its commodity value. Such problems involving package cracks and peelings have recently been remarkable with the advancement of thinning of the packages stated above.

The problems involving package cracks and peelings are caused by the deteriorated adhesion property between resins and die pads. An oxide film of a lead frame base material has the greatest influence on the resistance of peel off between the resin and the die pad. The lead frame base material has been subjected to various heating processes for producing the sheet or the lead frames. Accordingly, an oxide film with a thickness of several tens to several hundreds of nanometers is formed on the surface of the base material before the plating process by Ag or the like. On the surface of the die pad, a copper alloy and the resin are in contact with each other via the oxide film, hence the peeling of the oxide film from the lead frame base material directly leads to the peeling between the resin and the die pad, causing the resistance of peel off between the resin and the lead frame base material to be remarkably decreased.

Accordingly, the problem involving the package crack and the peeling depends on the resistance of peel off between the oxide film and the lead frame base material. Therefore, the above stated Cu—Fe—P alloy with a high strength is required as a lead frame base material to have a high resistance of peel off of the oxidation film formed on its surface through various heating processes.

With respect to such problem, many measures have not been proposed so far; however, Patent Document 8 proposes that the resistance of peel off of the oxidation film can be improved by controlling a crystalline orientation in the surface layer of a copper alloy pole. That is, Patent Document 8 proposes that, in a crystalline orientation in a pole surface evaluated by the thin film method using an XRD of the lead frame base material copper alloy, the resistance of peel off of the oxidation film can be improved by the measures that a ratio of the peak intensity of {100} to the peak intensity of {111} should be 0.04 or less. It is noted that Patent Document 8 includes every kind of copper alloys for lead frames; however, the Cu—Fe—P alloys substantially exemplified are only a Cu—Fe—P alloy with Fe content of 2.4% or more, which is a large content.

[Patent Document 1] Japanese Patent Laid-Open No. 2000-328158 (entire description)
[Patent Document 2] Japanese Patent Laid-Open No. 2002-339028 (entire description)
[Patent Document 3] Japanese Patent Laid-Open No. 2000-328157 (Claims for the Patent)
[Patent Document 4] Japanese Patent Laid-Open No. 2006-63431 (Claims for the Patent)
[Patent Document 5] Japanese Patent Laid-Open No. 2003-96526 (entire description)
[Patent Document 6] Japanese Patent Laid-Open No. 2004-91895 (entire description)
[Patent Document 7] Japanese Patent Laid-Open No. 2005-139501 (entire description)
[Patent Document 8] Japanese Patent Laid-Open No. 2001-244400 (entire description)

DISCLOSURE OF THE INVENTION

In Patent Documents 1 or 2 stated above, the stampability is improved by increasing an orientation density of the {220} plane and the {200} plane in the sheet surface. The stampability of a Cu—Fe—P alloy sheet is indeed improved by increasing an orientation density of these specific planes.

However, the above reduction in the cross-sectional areas of lead frames has been increasingly advancing, which entails increasing advancements of narrowing a lead width (from 0.5 mm to 0.3 mm) and thinning a sheet thickness (from 0.25 mm to 0.15 mm); hence there is an increasingly strict demand for the stampability at stamping, against a Cu—Fe—P alloy sheet with a high strength.

For this reason, the effect of the improved stampability achieved by controlling an orientation density of the texture as disclosed in Patent Documents 1 and 2, can no longer satisfy the requested stampability. In addition, the test conditions for evaluating the stampability adopted in the above Patent Documents 1 and 2, in which a lead is punched in a copper alloy sheet and a burr height occurring at the time is measured by SEM observation, can no longer properly evaluate the stampability that is requested of a Cu—Fe—P alloy sheet with a high strength.

The techniques disclosed by Patent Documents 6 and 7 that are intended to improve the softening resistance of a Cu—Fe—P alloy, or the technique disclosed by Patent Document 2 that has a different purpose, are insufficient to ensure such a high level of the softening resistance as intended by the present invention.

That is, the substantial Fe contents of the Cu—Fe—P alloys in those Patent Documents are large contents of at least more than 0.5%. In consideration of this, the techniques disclosed by these Patent Documents could be indeed effective for the improvement of the softening resistance of a Cu—Fe—P alloy with a large Fe content.

However, when Fe content is large exceeding 0.5%, another problem arises in which an electric conductivity and an Ag plating property thereof are deteriorated. Contrary to that, when intending, for example, to increase a precipitation amount of the above precipitated particles in order to increase an electric conductivity forcedly, it causes a problem in that the precipitated particles are adversely developed and coarse, resulting in a decreased strength and a decreased softening resistance. In other words, the techniques of these Patent Documents cannot provide both a high strength and a softening resistance that are requested of a Cu—Fe—P alloy.

Accordingly, when applying the techniques of these Patent Documents directly to the Cu—Fe—P alloy that is provided with a high strength by a composition in which Fe content is substantially reduced to 0.5% or less, the above high level of the softening resistance as requested of the above lead frame or the like cannot be acquired.

The technique of Patent Document 8 is insufficient to ensure such a high level of adhesion property with the oxide film as intended by the present invention.

That is, the substantial Fe content of the Cu—Fe—P alloy of Patent Document 8 is large exceeding at least more than 2.4 mass %, as stated above. In consideration of this, the technique of Patent Document 8 could be indeed effective for the improvement of the resistance of peel off of the oxidation film in a Cu—Fe—P alloy with a large Fe content. Truly, in patent Document 8, the resistance of peel off of the oxidation film in Example 1 of a Cu—Fe—P alloy with Fe content of 2.41%, is increased up to 633K (360° C.) in terms of an oxide film peeling critical temperature.

However, when Fe content is large exceeding more than 2.4 mass %, another problem arises in which not only the material properties, such as an electric conductivity, but also the productivity, such as casting property, are remarkably decreased. Truly, in Patent Document 8, the electric conductivity of the above example 1 of the Cu—Fe—P alloy is as low as 63% IACS, while the tensile strength thereof is relatively as high as 530 MPa.

Contrary to that, when intending, for example, to increase a precipitation amount of the above precipitated particles in order to increase an electric conductivity forcedly, it causes a problem in that the precipitated particles are adversely developed and coarse, resulting in a decreased strength and a decreased softening resistance. In other words, the techniques of Patent Document 8 cannot provide both the high strength and the resistance of peel off of the oxidation film.

Accordingly, when applying the techniques of patent Document 8 directly to the Cu—Fe—P alloy that is provided with a high strength by a composition in which Fe content is substantially reduced to 0.5% or less, the above adhesion property with the oxide film as requested of the above lead frame or the like cannot be acquired.

The present invention has been made to address the aforementioned problems, and an object of the invention is to provide a Cu—Fe—P alloy sheet in which both a high strength and an excellent stampability are acquired.

The present invention has been made to address the aforementioned problems, and an object of the invention is to provide a Cu—Fe—P alloy sheet in which both a high strength and a high softening resistance are acquired, and in which the both properties can also be provided by a composition in which Fe content is substantially reduced to 0.5% or less.

The present invention has been made to address the aforementioned problems, and an object of the invention is to provide a Cu—Fe—P alloy sheet in which both a high strength and an excellent adhesion property with the oxide film are acquired, and in which the both properties can also be provided by a composition in which Fe content is substantially reduced to 0.5% or less.

In order to attain the aforementioned object, the gist of a copper alloy sheet for an electric and electronic part excellent in the stampability according to the present invention, is that: the copper alloy sheet contains Fe 0.01 to 0.50 mass % and P 0.01 to 0.15 mass %, respectively, wherein a value obtained by dividing the half-value width of the intensity of diffraction of {311} plane by its peak height, should 0.15 or more.

The copper alloy sheet according to the present invention may further contain Sn 0.005 to 5.0 mass % in order to achieve a high strength, or further contain Zn 0.005 to 3.0 mass % in order to improve the heat resistant peeling property of the soldering and the Sn plating, respectively.

The copper alloy sheet according to the present invention preferably has a tensile strength of 500 MPa or more and a hardness of 150 Hv or more, as a guideline of a high strength. It is noted that an electric conductivity has a correlation with a strength of a sheet, and the high electric conductivity mentioned herein means that the sheet has a relatively high electric conductivity considering a high strength.

The copper alloy sheet according to the present invention may further contain a total content of 0.0001 to 1.0 mass % of one or more elements selected from Mn, Mg, and Ca.

The copper alloy sheet according to the present invention may further contain a total content of 0.001 to 1.0 mass % of one or more elements selected from Zr, Ag, Cr, Cd, Be, Ti, Co, Ni, Au, and Pt.

The copper alloy sheet according to the present invention may further contain a total content of 0.0001 to 1.0 mass % of one or more elements selected from Mn, Mg, and Ca; and further contain a total content of 0.001 to 1.0 mass % of one or more elements selected from Zr, Ag, Cr, Cd, Be, Ti, Co, Ni, Au, and Pt, respectively, wherein a total content of 1.0 mass % or less of these elements contained.

The copper alloy sheet according to the present invention preferably contains a total content of 0.1 mass % or less of Hf, Th, Li, Na, K, Sr, Pd, W, S, Si, C, Nb, Al, V, Y, Mo, Pb, In, Ga, Ge, As, Sb, Bi, Te, B, and misch metal.

The gist of a copper alloy sheet for an electric and electronic part according to the present invention in order to attain the aforementioned object, is that: the copper alloy sheet contains Fe 0.01 to 0.50 mass % and P 0.01 to 0.15 mass %, respectively, wherein a ratio(I(200)/I(220)) of the intensity of X-ray diffraction of (200) plane to the intensity (I(220)) of X-ray diffraction of the (220) plane, should be 0.3 or less.

The copper alloy sheet according to the present invention may further contain Sn 0.005 to 5.0 mass % in order to achieve a high strength, or further contain Zn 0.005 to 3.0 mass % in order to improve the heat resistant peeling property of the soldering and the Sn plating, respectively.

The copper alloy sheet according to the present invention preferably has a tensile strength of 500 MPa or more and a hardness of 150 Hv or more, as a guideline of a high strength. It is noted that an electric conductivity has a correlation with a strength of a sheet, and the high electric conductivity mentioned herein means that the sheet has a relatively high electric conductivity considering a high strength.

The copper alloy sheet according to the present invention may further contain a total content of 0.0001 to 1.0 mass % of one or more elements selected from Mn, Mg, and Ca.

The copper alloy sheet according to the present invention may further contain a total content of 0.001 to 1.0 mass % of one or more elements selected from Zr, Ag, Cr, Cd, Be, Ti, Co, Ni, Au, and Pt.

The copper alloy sheet according to the present invention may further contain a total content of 0.0001 to 1.0 mass % of one or more elements selected from Mn, Mg, and Ca; and further contain a total content of 0.001 to 1.0 mass % of one or more elements selected from Zr, Ag, Cr, Cd, Be, Ti, Co, Ni, Au, and Pt, respectively, wherein a total content of 1.0 mass % or less of these elements contained.

The copper alloy sheet according to the present invention preferably contains a total content of 0.1 mass % or less of Hf, Th, Li, Na, K, Sr, Pd, W, S, Si, C, Nb, Al, V, Y, Mo, Pb, In, Ga, Ge, As, Sb, Bi, Te, B, and misch metal.

The gist of a copper alloy sheet for an electric and electronic part according to the present invention in order to attain the aforementioned object, is that: the copper alloy sheet contains Fe 0.01 to 0.50 mass % and P 0.01 to 0.15 mass %, respectively, wherein, on the premise that two crystal orientations adjacent with each other having an orientation difference between them of 15° or less are viewed that they are located in the same crystal plane, the copper alloy sheet has a texture having 25% or more of the orientation distribution density of Brass orientation, which is measured by the crystal orientation analysis method using an Electron Backscatter Diffraction Pattern (EBSP) obtained by an Field Emission Scanning Electron Microscope (FE-SEM); and wherein the copper alloy sheet has an average grain size of 6.0 μm or less.

The copper alloy sheet according to the present invention may further contain Sn 0.005 to 5.0 mass % in order to achieve a high strength, or further contain Zn 0.005 to 3.0 mass % in order to improve the heat resistant peeling property of the soldering and the Sn plating, respectively.

The copper alloy sheet according to the present invention preferably has a tensile strength of 500 MPa or more and a hardness of 150 Hv or more, as a guideline of a high strength. It is noted that an electric conductivity has a correlation with a strength of a sheet, and the high electric conductivity mentioned herein means that the sheet has a relatively high electric conductivity considering a high strength.

The copper alloy sheet according to the present invention may further contain a total content of 0.0001 to 1.0 mass % of one or more elements selected from Mn, Mg, and Ca.

The copper alloy sheet according to the present invention may further contain a total content of 0.001 to 1.0 mass % of one or more elements selected from Zr, Ag, Cr, Cd, Be, Ti, Co, Ni, Au, and Pt.

The copper alloy sheet according to the present invention may further contain a total content of 0.0001 to 1.0 mass % of one or more elements selected from Mn, Mg, and Ca; and further contain a total content of 0.001 to 1.0 mass % of one or more elements selected from Zr, Ag, Cr, Cd, Be, Ti, Co, Ni, Au, and Pt, respectively, wherein a total content of 1.0 mass % or less of these elements contained.

The copper alloy sheet according to the present invention preferably contains a total content of 0.1 mass % or less of Hf, Th, Li, Na, K, Sr, Pd, W, S, Si, C, Nb, Al, V, Y, Mo, Pb, In, Ga, Ge, As, Sb, Bi, Te, B, and misch metal.

Effect of the Invention

The present invention seems to control the texture by specifying an intensity of X-ray diffraction from a specific crystal orientation in the sheet surface, as with the above Patent Documents 1 and 2. However, Patent Documents 1 and 2 substantially specify crystal orientations and intend to increase an orientation density of the {220} plane in order to lower a burr height at punching a lead in the copper alloy sheet.

However, there is a fundamental limitation on increasing an orientation density of a specific orientation in a copper alloy originally having random orientations. The limitation similarly lies when selecting crystal orientations, such as the {220} plane in Patent Documents 1 and 2, etc., and the {311} plane or the like specified by the present invention. For this reason, the effect of the improved stampability achieved by controlling an orientation density in the microstructures as shown in the above Patent Documents 1 and 2, can no longer satisfy the stampability requested of a Cu—Fe—P copper alloy sheet.

Contrary to that, the present invention controls a dislocation density in the microstructure in a Cu—Fe—P copper alloy sheet, not an orientation density of a specific orientation (crystal orientation) as is conventionally done. That is, the stampability is improved by increasing a dislocation density in a microstructure of a Cu—Fe—P copper alloy sheet. According to the knowledge of the present inventors, the dislocation density can be controlled in its amount to be introduced by the rolling conditions of the copper alloy sheet, and the control of the dislocation density makes significant contribution to the effect of improving the stampability.

However, the dislocation density is a very microscopic issue, hence it is very difficult to directly observe or quantify the dislocation density introduced in a microstructure a Cu—Fe—P copper alloy sheet. However, according to the knowledge of the present inventors, the dislocation density introduced in a microstructure a Cu—Fe—P copper alloy sheet has a close correlation with a half-value width of an intensity of diffraction, in particular, a value obtained by dividing the half-value width of the intensity of diffraction by its peak height. In this case, any intensity of diffraction equally has a correlation with the dislocation density. However, the intensity of diffraction of {311} plane in the sheet surface, which is specified by the present invention, is not so large (high) in its intensity of diffraction of which half-value width to be divided, as compared to those from other planes; and the half-value width thereof is large in its own way, hence, a value obtained by dividing the half-value width of the intensity of diffraction by its peak height, possesses a high reliability. Accordingly, the present invention specifies and quantifies the dislocation density using the intensity of diffraction of {311} plane in the sheet surface, in an accurate and reproducible fashion while in an indirect one.

As stated above, the present invention specifies the dislocation density amount using the half-value width of the intensity of diffraction of {311} plane in the sheet surface, the half-value width having a close correlation with the dislocation density; and improves the stampability, allowing the stampability requested of a Cu—Fe—P copper alloy sheet to be met. The present invention preferably improves the stampability of a Cu—Fe—P copper alloy sheet with a high strength in which a tensile strength is 500 MPa or more and a hardness is 150 Hv or more.

In the present invention, the reason why the X-ray diffraction intensity ratio (I(200)/I(220)) should be 0.3 or less is that: the development of the crystal orientation of Cube orientation is suppressed and the development of the crystal orientation of a specific orientation other than Cube orientation is enhanced, thereby an anisotropy of the sheet is enhanced, leading to a high softening resistance. Moreover, both a high strength and a high softening resistance can be acquired by a composition of a Cu—Fe—P copper alloy sheet, in which Fe content is substantially reduced to 0.5% or less.

Contrary to that, the above Patent Document 2 specifying by the same X-ray diffraction intensity ratio, specifies that I(200)/I(220) should be 0.5 or more to 10 or less. This is because: Patent Document 2 intends, contrary to the present invention, to develop the crystal orientation of Cube orientation and to suppress the development of the crystal orientation of a specific orientation other than Cube orientation, thereby intending to suppress the anisotropy in order to improve the above workability. With this, both a high strength and a high softening resistance cannot be acquired in a Cu—Fe—P copper alloy sheet with a composition in which Fe content is substantially reduced to 0.5% or less.

In a typical copper alloy sheet, textures referred to as Cube orientation, Goss orientation, Brass orientation (hereinafter, sometimes referred to as B orientation), Copper orientation (hereinafter, sometime referred to as Cu orientation), and S orientation, or the like, are formed, and crystal planes corresponding to them are located.

Formations of these textures are different in accordance with methods of processing and heat treatments even in the same crystal system. In the case of a sheet material produced by a rolling process, textures are represented by a rolled plane and a rolled direction, wherein the rolled plane is represented by {ABC} and the rolled direction by <DEF>. According to such representations, each orientation is represented as follows:

| | |
|---|---|
| Cube orientation {001} <100> | |
| Goss orientation {011} <100> | |
| Rotated-Goss orientation | {011} <011> |
| Brass orientation (B orientation) {011} <211> | |
| Copper orientation (Cu orientation) | {112} <111> (Or D orientation {4 4 11} <11 11 8>) |
| S orientation | {123} <634> |
| B/G orientation | {011} <511> |
| B/S orientation | {168} <211> |
| P orientation | {011} <111> |

Herein, B orientation-Cu orientation-S orientation are located in fiber textures (β-fiber) which continuously change between each orientation.

As stated above, a texture of a typical copper alloy sheet is composed of quite a lot of orientation factors. When a structural ratio of these factors is changed, the plastic anisotropy of the sheet is changed, resulting in changes of properties, such as workability and formability.

In the above Patent Document 8, a resistance of peel off of the oxidation film is improved by the measures that, among these textures, in particular, a ratio of the {100} peak intensity to the {111} peak intensity is 0.04 or less. However, even when the orientation distribution densities of Cube orientation and Goss orientation are increased relative to that of Copper orientation (Cu orientation) in this way, a high strength is not acquired and a resistance of peel off of the oxidation film is not improved in a copper alloy sheet with a Cu—Fe—P based composition in which Fe content is reduced to 0.5% or less, the copper alloy sheet being targeted by the present invention. Accordingly, in a copper alloy sheet with a Cu—Fe—P based composition in which Fe content is small, both a high strength and a high softening resistance cannot be acquired.

Contrary to that, the present invention creates a texture having the same orientations as much as possible, by increasing (raising) the orientation distribution density of Brass orientation (110 plane). With this, both a high strength and a high softening resistance can be acquired in a copper alloy sheet with a Cu—Fe—P based composition in which Fe content is small.

That is, in a copper alloy sheet with a Cu—Fe—P based composition in which Fe content is small, a resistance of peel off of the oxidation film is significantly influenced by, in particular, the orientation distribution density of Brass orientation (B orientation) among the above textures. As the orientation distribution density of B orientation is larger, an rolled texture is more developed, leading to an increased strength and an improved adhesion property with the oxide film.

The copper alloy sheet according to the present invention is applicable to various electric and electronic parts, in particular, preferably used for a semiconductor lead frame, a semiconductor part.

REFERENCE NUMERALS

1 COPPER ALLOY SHEET
2 PUNCHED HOLE
3 CUTTING PLACE

BEST MODE FOR CARRYING OUT THE INVENTION (1)
In the Cu—Fe—P alloy sheet according to the present invention, the importance of each requirement for satisfying required properties used for a semiconductor lead frame or the like, and embodiments of the invention will be described specifically below.
(Half-Value Width)
In order to improve a stampability of a Cu—Fe—P alloy sheet such that the requested property is met, the present invention specifies that the Cu—Fe—P alloy sheet has a certain amount or more of a dislocation density, for example, a value obtained by dividing the half-value width of the intensity of diffraction of {311} plane in the sheet surface, by its peak height, is 0.015 or more. With this, more specifically, a stampability of a Cu—Fe—P alloy sheet with a high strength having a tensile strength of 500 MPa or more and a hardness of 150 Hv or more, can be improved.

When a value obtained by dividing the half-value width of the intensity of diffraction by its peak height is less than 0.015, an amount of the dislocation density introduced in the sheet is small. With this, there is no significant difference from a conventional Cu—Fe—P alloy sheet in which an amount of the dislocation density is small, hence, the stampability thereof is decreased or not improved.

Figure 1:
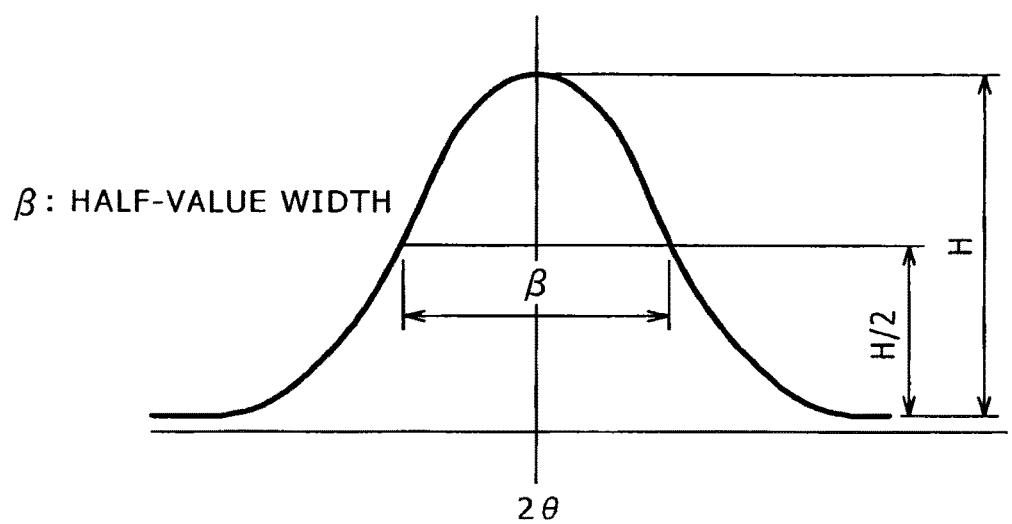
FIG. 1 is a schematic graph showing a half-value width of an intensity of diffraction.

As is well known, the half-value width is defined as the width ($\beta$) of an intensity of diffraction (height H) at half its height (H/2) of the intensity of diffraction, which is represented by the vertical axis: X-ray diffraction intensity and the horizontal axis: angle ($2\theta$), as schematically shown in FIG. 1. Incidentally, the half-value width is usually used for determining or quantifying the crystallinity and amorphous nature, crystallite size, and lattice distortion of a metal surface. Contrary to that, the present invention specifies a dislocation density, which cannot be directly observed or quantified, by a value obtained by dividing the half-value width $\beta$ of the intensity of diffraction of {311} plane in a sheet surface, by its peak height; wherein the value has a close correlation with the dislocation density. It is noted that, among x-ray diffraction peak intensities in the surface of a Cu—Fe—P alloy sheet, the half-value width ($\beta$) of the intensity of diffraction of {220} plane and its peak height (H) are largest. However, as a height of an intensity of diffraction is large (high), its peak height by which the half-value width of the intensity of diffraction is divided is large; accordingly, a value obtained by dividing the half-value width of the intensity of diffraction by its peak height, is too small, resulting in a larger error of the value per se, and the less reproducibility. Therefore, the present invention has adopted the intensity of diffraction of {311} plane in which a value obtained by dividing the half-value width thereof by its peak height is large (the peak height is not so high and the half-value width is large in its own way).

The present invention consistently tackles the state where a dislocation density is introduced in the sheet rather than controlling an orientation density of a microstructure, a grain size in the surface of a sheet, or a rolled texture, by the intensity of diffraction of a specific crystal plane in the surface of a sheet, as the above stated Patent Documents 1 and 2. In other words, a state where a dislocation density is introduced in a sheet cannot be specified or controlled by the intensity of diffraction of a specific crystal plane in the sheet surface, or by the control of an orientation density of a microstructure, a grain size in the sheet surface, or a rolled texture.

(Introduction of Dislocation Density)
In order to introduce a dislocation density having a value of 0.015 or more that is obtained by dividing the half-value width of the intensity of diffraction of {311} plane in the surface of a Cu—Fe—P alloy sheet, by its peak height, an amount of a deformation to be introduced in the final cold-rolling is made large, as stated later. That is, a copper alloy sheet is cold-rolled in the final cold-rolling by using the measures selected from: use of a roll having a small diameter of less than 80 mm$\phi$; a reduction ratio per one pass of 20% or more; and use of a roll having a length (width) of 500 mm or more. Alternatively, a copper alloy sheet is cold-rolled in combination of these measures.

(Shear Plane Ratio)
As stated above, the test conditions for evaluating a stampability adopted in Patent Documents 1 and 2, in which a lead is punched in a copper alloy sheet and a burr height occurring at the time is measured, can no longer evaluate the requested stampability properly.

Therefore, in the present invention, a stampability is more properly evaluated by a shear plane ratio of a cross section of a lead formed by a press punching that simulates a punching of a lead in a copper alloy sheet. When the shear plane ratio is 75% or less, a stampability can be evaluated as good. Of course, the stampability evaluation by this method may be supported by coupling with the measurement of a burr height.

Figure 2:
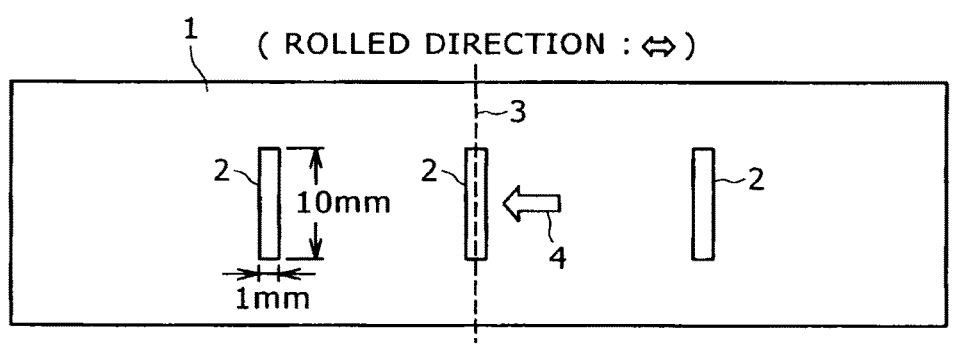
FIG. 2 is an illustrative diagram showing a method for measuring a shear plane ratio.

In the case, in order to ensure the reproducibility in the measurement of a shear plane ratio in the press punching test, test conditions thereof are specified specifically to the extent enough to ensure the reproducibility. That is, the press punching test is carried out as follows: a lead of 1 mm in width×10 mm in length is punched out by using a punching press (clearance: 5%) and a lubricating oil G-6316 manufactured by NIHON KOHSAKUYU CO., LTD, such that the length direction of the lead faces perpendicularly to the rolling direction of a copper alloy sheet 1, as shown in FIG. 2.

Subsequently, the copper alloy sheet was cut at the center of the punched hole 2 along the length direction of the hole (the cut portion is represented by the dot line 3); then, a shear plane ratio was determined by observing the cut cross section of the punched hole 2 from the arrow 4 direction, and by image analysis of a surface picture of the cut cross section taken by an optical microscope. The shear ratio is specified by the ratio of the shear plane area to the cut cross sectional area (shear plane area/cut cross sectional area), wherein the cut cross sectional area was obtained by multiplying the thickness of a copper alloy sheet 0.15 mm by the measurement width 0.5 mm, and the shear plane area was set to a shear plane area within the range of the measurement width 0.5 mm. Three holes were punched out per a specimen and three measurements were carried out at 3 points per each hole (total 9 points), thereafter a mean value thereof was calculated.

(Component Composition of Copper Alloy Sheet)

In the present invention, both a high strength and a stampability are acquired for the use in a semiconductor lead frame or the like, in which a tensile strength is 500 MPa or more and a hardness is 150 Hv or more. To realize this, a Cu—Fe—P alloy sheet has a basic composition in which Fe content is 0.01 to 0.50 mass %, P content is 0.01 to 0.15 mass %, and the remainder is composed of Cu and inevitable impurities.

With respect to the basic composition, an aspect of the present invention may further contain either one or both of Zn and Sn within the following content. Also, other elements to be added optionally and impurities may also be contained as long as the properties of the sheet are not impaired. All of the contents of alloy elements and impurities are represented by mass %.

(Fe)

Fe is a major element that precipitates as Fe or a Fe-group intermetallic compound to increase a strength and a softening resistance of a copper alloy. When Fe content is less than 0.01%, the above precipitated particles is generated in a small amount in accordance with the production conditions; hence, contribution to the increase in the strength is insufficient, resulting in a decreased strength, while improvement of an electric conductivity is satisfied. On the other hand, when Fe content exceeds 0.50%, an electric conductivity and an Ag plating property are deteriorated. When intending to increase a precipitation amount of the above precipitated particles in order to increase an electric conductivity forcedly, the precipitated particles are adversely too developed and coarse, thereby resulting in a decreased strength and a decreased stampability. Accordingly, Fe content should be within the range of 0.01 to 0.50%.

(P)

P is a major element with a function of forming a compound with Fe to increase a strength of a copper alloy, in addition to a deoxidizing action. When P content is less than 0.01%, a precipitated Compound is generated in a small amount in accordance with production conditions, resulting in a failure to acquire a desired strength. On the other hand, when P content exceeds 0.15%, not only an electric conductivity but also a hot workability and a stampability are deteriorated. Accordingly, P content should be within the range of 0.01 to 0.15%.

(Zn)

Zn improves a heat resistant peeling property of a solder of a copper alloy and an Sn plating that are required of a lead frame, etc. When Zn content is less than 0.005%, a desired effect cannot be acquired. On the other hand, when Zn content exceeds 3.0%, not only a solder wettability but also an electric conductivity is greatly deteriorated. Accordingly, Zn content should, when optionally contained, be selected within the range of 0.005 to 3.0% in accordance with (in consideration of) the balance between an electric conductivity and a heat resistant peeling property of the soldering and the Sn plating that are requested of an application.

(Sn)

Sn contributes to an increase in a strength of a copper alloy. When Sn content is less than 0.001%, it fails to contribute to the increase in a strength. On the other hand, when Sn content is large, the effect of Sn is saturated to conversely incur a decrease in an electric conductivity. Accordingly, Sn content should, when optionally contained, be selected within the range of 0.001 to 5.0% in accordance with (in consideration of) the balance between a strength (hardness) and an electric conductivity that are requested of an application.

(Contents of Mn, Mg, Ca)

Mn, Mg, and Ca contribute to an improvement of a hot workability of a copper alloy, hence, these elements are optionally contained when the effect is necessary. When a total content of one or more elements selected from Mn, Mg, and Ca is less than 0.0001%, a desired effect cannot be acquired. On the other hand, when a total content thereof exceeds 1.0%, not only a strength and a softening resistance of a copper alloy are decreased but also an electric conductivity is drastically decreased due to generation of coarse dispersoids and oxides. Accordingly, these elements should be optionally contained in a total content of 0.0001 to 1.0%.

(Contents of Zr, Ag, Cr, Cd, Be, Ti, Co, Ni, Au, Pt)

These elements are effective for increasing a strength of a copper alloy, hence, they are optionally contained when the effect is necessary. When a total content of one or more elements selected from these elements is less than 0.001%, a desired effect cannot be acquired. On the other hand, when a total content thereof exceeds 1.0%, it is not preferable because not only a strength and a softening resistance of a copper alloy are decreased but also an electric conductivity is drastically decreased due to generation of coarse dispersoids and oxides. Accordingly, these elements should be optionally contained in a total content of 0.001 to 1.0%. When these elements are contained in conjunction with the above Mn, Mg, and Ca, a total content of these elements to be contained should be 1.0% or less.

(Contents of Hf, Th, Li, Na, K, Sr, Pd, W, S, Si, C, Nb, Al, V, Y, Mo, Pb, In, Ga, Ge, As, Sb, Bi, Te, B, Misch Metal)

These elements are impurity elements, and when a total content of these elements exceeds 0.1%, a strength and a softening resistance thereof are decreased due to generation of coarse dispersoids or oxides. Accordingly, a total content of these elements is preferably 0.1% or less.

(Production Condition)

Preferable production conditions for making a microstructure of a copper alloy sheet compatible with the above-described microstructure specified by the present invention, will be described below. The copper alloy sheet according to the present invention does not require the normal production process per se to be changed drastically and can be produced through the same process as the normal one, except preferable conditions, e.g., the final cold-rolling conditions to attain the above-described microstructure specified by the present invention in which the dislocation density is introduced.

That is, a copper alloy melt adjusted so as to have the above-described preferable component composition is cast. The resulting ingot is subjected to facing, and to a heat treatment or a homogenization heat treatment. Thereafter, a hot-rolling is performed, and a hot-rolled sheet is water-cooled.

Subsequently, a primary cold-rolling referred to as an intermediate rolling is performed, followed by an annealing and a cleaning. Furthermore, a finish (final) cold rolling and a low-temperature annealing (final annealing, finish annealing) are performed, so that a copper alloy sheet and the like having a product sheet thickness is produced. These annealing and cold-rolling may be performed repeatedly. For example, when the copper alloy sheet is used for a semiconductor material, e.g., a lead frame, a product sheet thickness is about 0.1 to 0.4 mm.

A solution treatment and a quenching treatment by water-cooling of the copper alloy sheet may be performed before the primary cold-rolling. At this time, a solution treatment temperature is selected within the range of 750 to 1000° C., for example.

(Final Cold-Rolling)

In order to introduce a dislocation density having a value of 0.015 or more that is obtained by dividing the half-value width of the intensity of diffraction of {311} plane in the surface of a Cu—Fe—P alloy sheet, by its peak height, an amount of a deformation to be introduced in the final cold-rolling is made large, as stated later. That is, a copper alloy sheet is cold-rolled in the final cold-rolling by using the measures selected from: use of a roll having a small diameter of less than 80 mmφ; a minimum reduction ratio per one pass (cold-rolling ratio, processing ratio) of 20% or more; and use of a roll having a length (width) of 500 mm or more. Alternatively, a copper alloy sheet is cold-rolled in combination of these measures.

When the roll diameter is too small, the minimum reduction ratio per one pass is too small, or the roll length is too small, in the final cold-rolling, there is a high probability of a lack of the dislocation density introduced in the Cu—Fe—P alloy sheet. Accordingly, the value obtained by dividing the half-value width of the intensity of diffraction of {311} plane in the sheet surface, by its peak height, is less than 0.015; hence there is no significant difference from a conventional Cu—Fe—P alloy sheet in which an amount of the dislocation density is small. In the case, the stampability is decreased or not improved.

Preferably, the number of passes of the final cold-rolling is usually set at 3 to 4 times to prevent the number of passes from becoming too small or too large. A reduction ratio exceeding 50% per one pass is not necessary, and each reduction ratio per one pass is determined in consideration of an original sheet thickness, a final sheet thickness after cold-rolled, the number of passes, the above minimum reduction ratio per one pass, and the maximum reduction ratio thereof.

(Final Annealing)

In the present invention, it is preferable that a low-temperature final annealing is performed after the final cold-rolling. The final annealing is preferably performed under low-temperature conditions of 100 to 400° C. for 0.2 minutes or more to 30 minutes or less. In a usual method for producing a copper alloy sheet used for a lead frame, the final annealing is not performed after the final cold-rolling in order to avoid a decrease in strength, except an annealing for relieving a stress (350° C. for about 20 seconds). However, in the present invention, the decrease in strength can be suppressed by the above-described cold-rolling conditions and by a lowered temperature in the final annealing. When the final annealing is performed at a low-temperature, a stampability is improved.

Under the conditions that the annealing temperature is lower than 100° C., the annealing time is less than 0.2 minutes, or this low-temperature annealing is not performed, there is a high probability that a microstructure and properties of a copper alloy sheet are hardly changed from the state after the final cold-rolling. Conversely, when the annealing is performed at a temperature exceeding 400° C. or the annealing is performed for more than 300 minutes, the recrystallization occurs, the rearrangement and the recovery phenomena of the dislocation occur excessively, and the precipitates become coarse; therefore, there is a high probability that a stampability and a strength are decreased.

Example 1

Examples of the present invention will be described below. Copper alloy thin sheets having various half-value widths (dislocation densities) of the X-ray diffraction peak intensities from the {311} planes in the sheet surfaces, were produced by changing a roll diameter and a minimum reduction ratio per one pass. Subsequently, properties, e.g., a tensile strength, a hardness, an electric conductivity, and a shear plane ratio or the like of the each copper alloy thin sheet were evaluated. The results of the evaluations are shown in Table 1.

TABLE 1

| | | CHEMICAL COMPONENT COMPOSITION OF COPPER ALLOY SHEET (REMAINDER: Cu AND IMPURITIES) | | | | | FINISH COLD-ROLLING | |
|---|---|---|---|---|---|---|---|---|
| CLASSIFICATION | ALLOY NO. | Fe | P | Zn | Sn | OTHERS | ROLL DIAMETER mm | MINIMUM REDUCTION RATIO %/ONE PASS |
| EXAMPLES OF INVENTION | 1 | 0.27 | 0.11 | 1.1 | 0.020 | — | 60 | 30 |
| | 2 | 0.27 | 0.12 | 0.28 | 2.1 | — | 40 | 40 |
| | 3 | 0.17 | 0.057 | 0.046 | 0.023 | — | 60 | 25 |
| | 4 | 0.17 | 0.059 | 0.049 | 0.10 | — | 70 | 25 |
| | 5 | 0.16 | 0.052 | 0.052 | 0.54 | — | 40 | 35 |
| | 6 | 0.05 | 0.11 | — | — | — | 70 | 25 |

TABLE 1-continued

| CLASSIFICATION | | Alloy No. | Co | P | Sn | Zn | Others | Roll diameter (mm) | Reduction ratio (%) |
|---|---|---|---|---|---|---|---|---|---|
| | | 7 | 0.47 | 0.11 | — | — | — | 50 | 30 |
| | | 8 | 0.27 | 0.030 | — | — | — | 60 | 20 |
| | | 9 | 0.27 | 0.13 | — | — | — | 60 | 30 |
| | | 10 | 0.27 | 0.11 | 0.28 | 0.020 | Mn: 0.003 | 60 | 25 |
| | | 11 | 0.27 | 0.11 | 0.28 | 0.020 | Ca: 0.002, Ti: 0.005 | 60 | 25 |
| | | 12 | 0.27 | 0.11 | 0.28 | 0.020 | Mn: 0.003, Ni: 0.01, Al: 0.001 | 60 | 25 |
| | | 13 | 0.27 | 0.11 | 0.28 | 0.020 | Mg: 0.003, Ag: 0.1 | 60 | 25 |
| | | 14 | 0.27 | 0.11 | 0.28 | 0.020 | Ca: 0.002, Zr: 0.005 | 60 | 25 |
| COMPARATIVE EXAMPLES | | 15 | 0.11 | 0.035 | 0.020 | 0.010 | — | 100 | 15 |
| | | 16 | 0.11 | 0.035 | 0.020 | 0.010 | — | 100 | 25 |
| | | 17 | 0.11 | 0.036 | 0.017 | — | — | 60 | 15 |
| | | 18 | 0.006 | 0.11 | 0.28 | 0.020 | — | 60 | 25 |
| | | 19 | 0.55 | 0.11 | 0.28 | 0.020 | — | 60 | 25 |
| | | 20 | 0.27 | 0.007 | 0.28 | 0.020 | — | 60 | 25 |
| | | 21 | 0.27 | 0.16 | 0.28 | 0.020 | — | 60 | 25 |

| | | | MICROSTRUCTURE OF COPPER ALLOY SHEET HALF-VALUE WIDTH OF | PROPERTIES OF COPPER ALLOY SHEET | | | |
|---|---|---|---|---|---|---|---|
| CLASSIFICATION | | ALLOY NO. | X-RAY DIFFRACTION PEAK INTENSITY FROM (311) PLANE/PEAK HEIGHT | TENSILE STRENGTH MPa | HARDNESS Hv | ELECTRIC CONDUCTIVITY % IACS | SHEAR PLANE RATIO |
| EXAMPLES OF INVENTION | | 1 | 0.023 | 570 | 170 | 72 | 73 |
| | | 2 | 0.146 | 770 | 240 | 34 | 60 |
| | | 3 | 0.020 | 550 | 160 | 83 | 74 |
| | | 4 | 0.023 | 580 | 170 | 78 | 73 |
| | | 5 | 0.107 | 660 | 200 | 58 | 66 |
| | | 6 | 0.019 | 520 | 155 | 86 | 75 |
| | | 7 | 0.022 | 580 | 170 | 81 | 72 |
| | | 8 | 0.019 | 525 | 155 | 85 | 75 |
| | | 9 | 0.021 | 560 | 165 | 82 | 73 |
| | | 10 | 0.020 | 550 | 160 | 82 | 74 |
| | | 11 | 0.020 | 560 | 165 | 81 | 73 |
| | | 12 | 0.021 | 575 | 170 | 80 | 73 |
| | | 13 | 0.022 | 590 | 175 | 78 | 72 |
| | | 14 | 0.020 | 560 | 165 | 82 | 73 |
| COMPARATIVE EXAMPLES | | 15 | 0.011 | 410 | 130 | 88 | 80 |
| | | 16 | 0.013 | 440 | 135 | 86 | 79 |
| | | 17 | 0.014 | 480 | 145 | 84 | 78 |
| | | 18 | 0.019 | 460 | 140 | 85 | 78 |
| | | 19 | 0.020 | 495 | 150 | 75 | 77 |
| | | 20 | 0.019 | 470 | 140 | 84 | 78 |
| | | 21 | 0.020 | 490 | 145 | 76 | 77 |

*IN REPRESENTATION OF EACH ELEMENT CONTENT, "—" INDICATES UNDER DETECTION LIMIT

Specifically, each copper alloy having a chemical component composition shown in Table 1 was melted in a coreless furnace, and an ingot-making was performed by a semi-continuous casting method, so that an ingot of 70 mm in thickness×200 mm in width×500 mm in length was prepared. The surface of each ingot was subjected to facing, followed by heating. Thereafter, the hot-rolling was performed at a temperature of 950° C. to prepare a sheet of 16 mm in thickness, and the resulting sheet was quenched in water from a temperature of 750° C. or more. The oxidized scale was removed and, thereafter, the primary cold-rolling (intermediate rolling) was performed. The resulting sheet was subjected to facing and, thereafter, the final cold-rolling was performed in which 4 passes of the cold-rolling were performed with the intermediate annealing therebetween. Subsequently, the final annealing was performed under low-temperature conditions at 350° C. for 20 seconds, so that a copper alloy sheet of 0.15 mm in thickness corresponding to the thinning of lead frames was produced.

The roll diameter (mm) and the reduction ratio (%) per one pass in the final cold-rolling are shown in Table 1, respectively. In the final cold-rolling, rolls having the same roll diameter were used through 4 passes. Even when the roll diameter was changed, the length thereof was set to a constant length of 500 mm.

In each copper alloy shown in Table 1, the remainder of the composition excluding the described elements was Cu. A total content of other impurity elements of Hf, Th, Li, Na, K, Sr, Pd, W, S, Si, C, Nb, Al, V, Y, Mo, Pb, In, Ga, Ge, As, Sb, Bi, Te, B, and misch metal was 0.1 mass % or less including the elements described in Table 1.

In the case where one or more elements selected from Mn, Mg, and Ca, were contained, a total content thereof was specified to be within the range of 0.0001 to 1.0 mass %. In the case where one or more elements selected from Zr, Ag, Cr, Cd, Be, Ti, Co, Ni, Au, and Pt, were contained, a total content was specified to be within the range of 0.001 to 1.0 mass %. Furthermore, a total content of all these elements was specified to be within the range of 1.0 mass % or less.

In each example, a specimen was cut out from the copper alloy sheet thus prepared, such that properties of each specimen such as a dislocation density (texture), a tensile strength, a hardness, an electric conductivity, and a shear plane ratio or the like, were evaluated. The results are shown in Table 1.

(Measurement of Half-Value Width)

In each copper alloy sheet specimen, an X-ray diffraction pattern was obtained by a usual X-ray diffraction method using an X-ray diffractometer (manufactured by Rigaku Corporation) through the use of Co as a target on condition that the tube voltage was 50 kV, the tube current 200 mA, the scanning speed 2°/min, the sampling width 0.02°, and the measurement range (26) 30° to 115°. From the X-ray diffraction pattern, the half-value width of the intensity of diffraction of {311} plane in the sheet surface, was determined by the method described previously.

Measurements were conducted at two points, and an average value thereof was taken as the half-value width.

(Measurement of Hardness)

Measurement of hardness of a copper alloy sheet specimen was conducted at 3 points with a micro Vickers hardness tester by applying a load of 0.5 kg, and an average value thereof was taken as the hardness.

(Measurement of Electric Conductivity)

The copper alloy sheet specimen was processed into a slip-shaped test piece of 10 mm in width×300 mm in length by milling, and an electric resistance was measured with a double bridge resistance meter, and the electric conductivity was calculated by an average cross-sectional area method.

(Measurement of Shear Plane Ratio)

A shear plane ratio of the copper alloy sheet specimen was measured by the above-stated test conditions. When performing an image analysis of a surface picture of the cutting plane using an optical microscope, a maximum burr height of a formed lead was measured as reference.

As is clear in Table 1, Examples 1 to 14 of the present invention, copper alloys having compositions within the scope of the present invention, are produced by production methods performed on condition that a roll diameter and a minimum reduction ratio per one pass or the like in the final cold-rolling are within the preferable range. Accordingly, each of Examples 1 to 14 of the present invention has a dislocation density having a value of 0.015 or more that is obtained by dividing the half-value width of the intensity of diffraction of {311} plane in the sheet surface, by its peak height.

As a result, each of Examples 1 to 14 of the present invention has a relatively high electric conductivity, considering that it has a high strength with a tensile strength of 500 MPa or more and a hardness of 150 Hv or more; and has a shear plane ratio of 75% or less and also has an excellent stampability.

Contrary to that, in each of Comparative Examples 15 to 17, a roll diameter and a minimum reduction ratio in the final cold-rolling are too large, although it is a copper alloys having a composition within the scope of the present invention. Accordingly, in each of Comparative Examples 15 to 17, the value obtained by dividing the half-value width of the intensity of diffraction of {311} plane in the sheet surface, by its height, is less than 0.015; hence the dislocation density is too small. As a result, each of Comparative Examples 15 to 17 has a shear plane ratio of 78% or more and has a remarkably decreased stampability considering a low level of strength.

In the copper alloy of Comparative Example 18, Fe content is 0.006%, and is out of the lower limit of 0.01%. On the other hand, the copper alloy sheet is produced by a production method performed on condition that the roll diameter and the minimum reduction ratio per one pass or the like in the final cold-rolling are within the preferable ranges. Accordingly, although the copper alloy has a dislocation density having a value of 0.015 or more that is obtained by dividing the half-value width of the intensity of diffraction of {311} plane in the sheet surface, by its peak height; the copper alloy has a high shear plane ratio considering a low strength and a hardness, and the copper alloy has a decreased stampability, and also fails to attain a high strength.

In the copper alloy of Comparative Example 19, Fe content is 0.55%, and is out of the upper limit of 5.0%; however, the copper alloy is produced by a production method performed on condition that the final cold-rolling or the like are within the preferable ranges. Accordingly, although the copper alloy has a dislocation density having a value of 0.015 or more that is obtained by dividing the half-value width of the intensity of diffraction of {311} plane in the sheet surface, by its peak height; the copper alloy has a high shear plane ratio, a decreased stampability, and a remarkably decreased electric conductivity.

In the copper alloy of Comparative Example 20, P content is 0.007%, and is out of the lower limit of 0.01%; however, the copper alloy is produced by a production method performed on condition that the final cold-rolling or the like are within the preferable ranges. Accordingly, although the copper alloy has a dislocation density having a value of 0.015 or more that is obtained by dividing of the half-value width of the intensity of diffraction of {311} plane in the sheet surface, by its peak height; the copper alloy has a high shear plane ratio considering a low strength and a hardness, and the copper alloy has a decreased stampability, and also fails to attain a high strength.

In the copper alloy of Comparative Example 21, P content is 0.16%, and is out of the upper limit of 0.15%, thereby cracks occurred in the sheet end portion during hot-rolled. However, the copper alloy is produced by a production method performed on condition that the final cold-rolling or the like are within the preferable ranges. Accordingly, although the copper alloy has a dislocation density having a value of 0.015 or more that is obtained by dividing the half-value width of the intensity of diffraction of {311} plane in the sheet surface, by its peak height; the copper alloy has a high shear plane ratio, a decreased stampability, and a remarkably decreased electric conductivity.

(Burr Height)

In the copper alloys of the above Examples 1 to 14 of the present invention, all of the burr heights (maximum heights) observed in the above press punching test were 5 μm or less. In the copper alloys of the above Comparative Examples 15 to 17, all of the burr heights in the press punching test were also 5 μm or less, having almost the same performance as with the Examples of the present invention. On the other hand, in the Comparative Examples 18 to 21, all of the burr heights in the press punching test were more than 6 μm, having inferior performance to the Examples of the present invention.

Accordingly, the evaluation of the burr height in the press punching test can be applicable to the comparison and the distinction between copper alloys having extremely different stampability from each other (Examples 1 to 14 of the present invention and Comparative Examples 18 to 21). However, it is understood that the burr heights obtained from Examples 1 to 14 of the present invention and that obtained from Comparative Examples 15 to 17, do not have a significant difference between them, hence right and wrong cannot be distinguished. That is, it is understood that the evaluation of burr height is insufficient for evaluating the stampability at stamping a Cu—Fe—P alloy sheet that is provided with a high strength associated with the miniaturized lead width and thickness entailed by the growing reduction in the cross-sectional area of lead frames.

From these results, the importance of the items (described below) can be supported in order to provide both a high strength and an excellent stampability. The above issues are as follows: component composition of the copper alloy sheet according to the present invention; critical importance of the value obtained by dividing the half-value width of intensity of diffraction of {311} plane in the sheet surface by its peak height; and preferable production conditions to obtain such a microstructure.

(2)

In the Cu—Fe—P alloy sheet according to the present invention, the importance of each requirement for satisfying required properties used for a semiconductor lead frame or the like, and embodiments of the invention will be described specifically below.

(X-Ray Diffraction Intensity Ratio)

For the X-ray diffraction intensity ratio according to the present invention, the X-ray diffraction intensity (I(200)) of Cube orientation from the (200) plane and the X-ray diffraction intensity (I(220)) of an orientation other than Cube orientation from the (220) plane, are measured by using a usual X-ray diffraction method. Thereafter, the X-ray diffraction intensity ratio can be calculated from the ratio (X-ray diffraction peak ration) (I(200)/I(220)) of these X-ray diffraction intensities.

As stated above, a texture of a typical copper alloy sheet is composed of quite a lot of orientation factors. When a structural ratio of these factors is changed, the plastic anisotropy of the sheet is changed, leading to a change of a softening resistance. Among them, the softening resistance can be improved by properly controlling, in particular, the orientation density of Cube orientation (also referred to as D (C) cube) and a specific crystal orientation density other than Cube orientation.

Accordingly, the present invention specifies the ratio (I(200)/I(220)) of the X-ray diffraction intensity (I(200)) of Cube orientation from the (200) plane in the sheet surface to the X-ray diffraction intensity (I(220)) of an orientation other than Cube orientation from the (220) plane, as 0.3 or less, preferably 0.25 or less.

As stated above, with this, not only the development of Cube orientation can be suppressed but also the development of a specific orientation other than Cube orientation can be enhanced; hence the anisotropy of the copper alloy sheet can be enhanced, leading to a high softening resistance. Also, both a high strength and a high softening resistance can be provided by a composition of a Cu—Fe—P alloy sheet, in which Fe content is substantially reduced to 0.5% or less.

Contrary to that, when I(200)/I(220) exceeds 0.3, more strictly exceeds 0.25, Cube orientation is developed and the development of a specific crystal orientation other than Cube orientation is suppressed, resulting in the suppressed anisotropy, as stated above, the result being different from Patent Document 2 or the like. Therefore, both a high strength and a high softening resistance cannot be provided by a composition of a Cu—Fe—P alloy sheet, in which Fe content is substantially reduced to 0.5% or less.

(Component Composition of Copper Alloy Sheet)

In the present invention, both a high strength and a high softening resistance are acquired for the use in a semiconductor lead frame or the like, in which a tensile strength is 500 MPa or more, a hardness is 150 Hv or more, and an electric conductivity is 50% IACS or more. To realize this, a Cu—Fe—P alloy sheet has a basic composition in which Fe content is 0.01 to 0.50 mass %, P content is 0.01 to 0.15 mass %, and the remainder is composed of Cu and inevitable impurities.

With respect to the basic composition, an aspect of the present invention may further contain either one or both of Zn and Sn within the following content. Also, other elements to be added optionally and impurities may also be contained as long as the properties of the sheet are not impaired. All of the contents of alloy elements and impurities are represented by mass %.

(Fe)

Fe is a major element that precipitates as Fe or a Fe-group intermetallic compound to increase a strength and a hear resistance of a copper alloy. When Fe content is less than 0.01%, the above precipitated particles is generated in a small amount in accordance with the production conditions; hence, contribution to the increase in the strength is insufficient, resulting in a decreased strength, while improvement of an electric conductivity is satisfied. On the other hand, when Fe content exceeds 0.50%, an electric conductivity and an Ag plating property are deteriorated, as in the above conventional techniques. When intending to increase a precipitation amount of the above precipitated particles in order to increase an electric conductivity forcedly, the precipitated particles are adversely too developed and coarse, thereby resulting in a decreased strength, a decreased softening resistance, and a decreased stampability. Accordingly, Fe content should be within the relatively low range of 0.01 to 0.50%.

(P)

P is a major element with a function of forming a compound with Fe to increase a strength and a softening resistance of a copper alloy, in addition to a deoxidizing action. When P content is less than 0.01%, a precipitated compound is generated in a small amount in accordance with production conditions, resulting in a failure to acquire a desired strength and softening resistance. On the other hand, when P content exceeds 0.15%, not only an electric conductivity but also a softening resistance, a hot workability, and a stampability o the like are deteriorated. Accordingly, P content should be within the range of 0.01 to 0.15%.

(Zn)

Zn improves a heat resistant peeling property of a solder of a copper alloy and an Sn plating that are required of a lead frame, etc. When Zn content is less than 0.005%, a desired effect cannot be acquired. On the other hand, when Zn content exceeds 3.0%, not only a solder wettability but also an electric conductivity are greatly deteriorated. Accordingly, Zn content should, when optionally contained, be selected within the range of 0.005 to 3.0%, in accordance with (in consideration of) the balance between an electric conductivity and a heat resistant peeling property of the soldering and the Sn plating that are requested of an application.

(Sn)

Sn contributes to an increase in a strength of a copper alloy. When Sn content is less than 0.001%, it fails to contribute to the increase in a strength. On the other hand, when Sn content is large, the effect of Sn is saturated to conversely incur a decrease in an electric conductivity. Accordingly, Sn content should, when optionally contained, be selected within the range of 0.001 to 5.0% in accordance with (in consideration of) the balance between a strength (hardness) and an electric conductivity that are requested of an application.

(Contents of Mn, Mg, Ca)

Mn, Mg, and Ca contribute to an improvement of a hot workability of a copper alloy, hence, these elements are optionally contained when the effect is necessary. When a total content of one or more elements selected from Mn, Mg, and Ca is less than 0.0001%, a desired effect cannot be acquired. On the other hand, when a total content thereof exceeds 1.0%, not only a strength and a softening resistance of a copper alloy are decreased but also an electric conductivity is drastically decreased due to generation of coarse dispersoids and oxides. Accordingly, these elements should be optionally contained in a total content of 0.0001 to 1.0%.

(Contents of Zr, Ag, Cr, Cd, Be, Ti, Co, Ni, Au, Pt)

These elements are effective for increasing a strength of a copper alloy, hence, they are optionally contained when the effect is necessary. When a total content of one or more elements selected from these elements is less than 0.001%, a desired effect cannot be acquired. On the other hand, when a total content thereof exceeds 1.0%, it is not preferable because not only a strength and a softening resistance of a copper alloy are decreased but also an electric conductivity is drastically decreased due to generation of coarse dispersoids and oxides. Accordingly, these elements should be optionally contained in a total content of 0.001 to 1.0%. When these elements are contained in conjunction with the above Mn, Mg, and Ca, a total content of these elements to be contained should be 1.0% or less.

(Contents of Hf, Th, Li, Na, K, Sr, Pd, W, S, Si, C, Nb, Al, V, Y, Mo, Pb, In, Ga, Ge, As, Sb, Bi, Te, B, Misch Metal)

These elements are impurity elements, and when a total content of these elements exceeds 0.1%, a strength and a softening resistance thereof are decreased due to generation of coarse dispersoids or oxides. Accordingly, a total content of these elements is preferably 0.01% or less.

(Production Condition)

Preferable production conditions for making a microstructure of a copper alloy sheet compatible with the above-described microstructure specified by the present invention, will be described below. The copper alloy sheet according to the present invention does not require the normal production process per se to be changed drastically and can be produced through the same process as the normal one, except preferable conditions, e.g., the final cold-rolling conditions to attain the above-described microstructure specified by the present invention in which the texture is controlled.

That is, a copper alloy melt adjusted so as to have the above-described preferable component composition is cast. The resulting ingot is subjected to facing, and to a heat treatment or a homogenization heat treatment. Thereafter, a hot-rolling is performed, and a hot-rolled sheet is water-cooled. The normal production conditions may be applied in the hot-rolling process.

Subsequently, a primary cold-rolling referred to as an intermediate rolling is performed, followed by an annealing and a cleaning. Furthermore, a finish (final) cold rolling and a low-temperature annealing (final annealing, finish annealing) are performed, so that a copper alloy sheet and the like having a product sheet thickness is produced. These annealing and cold-rolling may be performed repeatedly. For example, when the copper alloy sheet is used for a semiconductor material, e.g., a lead frame, a product sheet thickness is about 0.1 to 0.4 mm.

A solution treatment and a quenching treatment by water-cooling of the copper alloy sheet may be performed before the primary cold-rolling. At this time, a solution treatment temperature is selected within the range of 750 to 1000° C., for example.

(Final Cold-Rolling)

In order to realize that the ratio (I(200)/I(220) of the intensity of X-ray diffraction of (200) plane to the X-ray diffraction intensity (I(220)) from the (220) plane, is 0.3 or less, it is necessary that a rolling speed in the final cold-rolling is large or a hardness of the roll (shear hardness) in the final cold-rolling is increased. That is, a copper alloy-sheet is cold-rolled in the final cold-rolling by using the measures selected from: a rolling speed of 200 m/min or more; and 60 Hv or more of a hardness (shear hardness) of the roll. Alternatively, a copper alloy sheet is cold-rolled in combination of these measures.

With this, even in the Cu—Fe—P alloy sheet with small Fe content according to the present invention, the development of the crystal orientation of Cube orientation can be suppressed and the development of the crystal orientation of a specific orientation other than Cube orientation is enhanced to enhance the anisotropy of the sheet. Thereby, the X-ray diffraction intensity ratio (I(200)/I(220)) can be 0.3 or less, leading to a high softening resistance.

On the other hand, in the Cu—Fe—P alloy sheet with small Fe content according to the present invention, when a rolling peed in the final cold-rolling is too small, or a hardness of the roll in the final cold-rolling is too low, in particular, the crystal orientation of Cube orientation is developed and the development of the crystal orientation of a specific orientation other than Cube orientation is suppressed, resulting in the suppressed anisotropy. Thereby, the X-ray diffraction intensity ratio ((I(200)/I(220)) cannot be 0.3 or less.

Also, in order to improve a stampability at stamping, an amount of a deformation introduced in the final cold-rolling, is made large. That is, a copper alloy sheet is cold-rolled in the final cold-rolling by using the measures selected from: use of a roll having a small diameter of less than 80 mm$\phi$, a minimum reduction ratio per one pass of 20% or more, and the use of a roll having a length (width) of 500 mm or more. Alternatively, a copper alloy sheet is cold-rolled in combination of these measures.

Preferably, the number of passes of the final cold-rolling is usually set at 3 to 4 times to prevent the number of passes from becoming too small or too large. A reduction ratio exceeding 50% per one pass is not necessary, and each reduction ratio per one pass is determined in consideration of an original sheet thickness, a final sheet thickness after cold-rolled, the number of passes, and the maximum reduction ratio.

(Final Annealing)

In the present invention, it is preferable that a low-temperature final annealing is performed after the final cold-rolling. The final annealing is preferably performed under low-temperature conditions of 100 to 400° C. for 0.2 minutes or more to 30 minutes or less. In a usual method for producing a copper alloy sheet used for a lead frame, the final annealing is not performed after the final cold-rolling in order to avoid the decrease in strength, except an annealing for relieving stresses (350° C. for about 20 seconds. However, in the present invention, the decrease in strength can be suppressed by the above-described cold-rolling conditions and by a lowered temperature in the final annealing. When the final annealing is performed at a low-temperature, a stampability is improved.

Under the conditions that the annealing temperature is lower than 100° C., the annealing time is less than 0.2 minutes, or this low-temperature annealing is not performed, there is a high probability that a microstructure and properties of a copper alloy sheet are hardly changed from the state after the final cold-rolling. Conversely, when the annealing is performed at a temperature exceeding 400° C. or the annealing is performed for more than 300 minutes, the recrystallization occurs, the rearrangement and the recovery phenomena of the dislocation occur excessively, and the precipitates become coarse; therefore, there is a high probability that a stampability and a strength are decreased.

Example 2

Examples of the present invention will be described below. Copper alloy thin sheets having various X-ray diffraction intensity ratios ((I(200)/I(220))) were produced by changing a rolling speed or a hardness of the roll (shear hardness) in the final cold-rolling. Subsequently, properties, e.g., a tensile strength, a hardness, and an electric conductivity or the like of the each copper alloy thin sheet were evaluated. Further, a softening resistance was evaluated by a decrease amount of the hardness after annealed at 500° C. for 1 minute. The results of the evaluations are shown in Table 2.

followed by heating. Thereafter, the hot-rolling was performed at a temperature of 950° C. to prepare a sheet of 16 mm in thickness, and the resulting sheet was quenched in water from a temperature of 750° C. or more. The oxidized scale was removed and, thereafter, the primary cold-rolling (intermediate rolling) was performed. The resulting sheet was subjected to facing and, thereafter, the final cold-rolling was performed in which 4 passes of the cold-rolling were performed with the intermediate annealing therebetween.

TABLE 2

| | | CHEMICAL COMPONENT COMPOSITION OF COPPER ALLOY SHEET (REMAINDER: Cu AND IMPURITIES) | | | | | FINISH COLD-ROLLING | |
|---|---|---|---|---|---|---|---|---|
| CLASSIFICATION | ALLOY NO. | Fe | P | Zn | Sn | OTHERS | ROLL DIAMETER m/min | SHEAR HARDNESS Hs |
| EXAMPLE OF INVENTION | 1 | 0.30 | 0.10 | 1.0 | 0.025 | — | 400 | 80 |
| | 2 | 0.29 | 0.10 | 0.29 | 2.1 | — | 400 | 90 |
| | 3 | 0.17 | 0.060 | 0.051 | 0.024 | — | 250 | 80 |
| | 4 | 0.17 | 0.061 | 0.049 | 0.098 | — | 300 | 90 |
| | 5 | 0.17 | 0.055 | 0.052 | 0.57 | — | 400 | 90 |
| | 6 | 0.05 | 0.10 | — | — | — | 250 | 70 |
| | 7 | 0.46 | 0.11 | — | — | — | 350 | 80 |
| | 8 | 0.29 | 0.027 | — | — | — | 300 | 70 |
| | 9 | 0.29 | 0.14 | — | — | — | 350 | 70 |
| | 10 | 0.29 | 0.10 | 0.27 | 0.025 | Mn: 0.003 | 250 | 80 |
| | 11 | 0.29 | 0.10 | 0.27 | 0.025 | Ca: 0.002, Ti: 0.005 | 250 | 80 |
| | 12 | 0.29 | 0.10 | 0.27 | 0.025 | Mn: 0.003, Ni: 0.01, Al: 0.001 | 250 | 80 |
| | 13 | 0.29 | 0.10 | 0.27 | 0.025 | Mg: 0.003, Ag: 0.1 | 250 | 80 |
| | 14 | 0.29 | 0.10 | 0.27 | 0.025 | Ca: 0.002, Zr: 0.005 | 250 | 80 |
| COMPARATIVE EXAMPLES | 15 | 0.10 | 0.035 | 0.035 | 0.015 | — | 100 | 50 |
| | 16 | 0.12 | 0.043 | 0.005 | 0.007 | — | 150 | 50 |
| | 17 | 0.11 | 0.035 | 0.020 | 0.010 | — | 150 | 80 |
| | 18 | 0.005 | 0.10 | 0.27 | 0.025 | — | 250 | 80 |
| | 19 | 0.55 | 0.10 | 0.27 | 0.025 | — | 250 | 80 |
| | 20 | 0.29 | 0.005 | 0.27 | 0.025 | — | 250 | 80 |
| | 21 | 0.29 | 0.17 | 0.27 | 0.025 | — | 250 | 80 |

| | | MICROSTRUCTURE OF COPPER ALLOY SHEET | PROPERTIES OF COPPER ALLOY SHEET | | | |
|---|---|---|---|---|---|---|
| CLASSIFICATION | ALLOY NO. | X-RAY DIFFRACTION INTENSITY RATIO I(200)/I(220) | TENSILE STRENGTH MPa | HARDNESS Hv | ELECTRIC CONDUCTIVITY % IACS | DECREASE IN HARDNESS WHEN ANNEALED Hv |
| EXAMPLE OF INVENTION | 1 | 0.08 | 575 | 175 | 71 | 15 |
| | 2 | 0.04 | 750 | 230 | 35 | 12 |
| | 3 | 0.24 | 555 | 165 | 83 | 24 |
| | 4 | 0.17 | 570 | 170 | 79 | 19 |
| | 5 | 0.04 | 665 | 205 | 57 | 24 |
| | 6 | 0.28 | 525 | 155 | 86 | 28 |
| | 7 | 0.15 | 585 | 175 | 80 | 17 |
| | 8 | 0.25 | 520 | 155 | 86 | 26 |
| | 9 | 0.20 | 570 | 170 | 81 | 21 |
| | 10 | 0.24 | 555 | 165 | 81 | 23 |
| | 11 | 0.25 | 565 | 170 | 81 | 25 |
| | 12 | 0.24 | 575 | 175 | 80 | 24 |
| | 13 | 0.23 | 595 | 180 | 77 | 22 |
| | 14 | 0.24 | 565 | 170 | 81 | 24 |
| COMPARATIVE EXAMPLES | 15 | 0.56 | 415 | 130 | 88 | 65 |
| | 16 | 0.51 | 430 | 135 | 87 | 58 |
| | 17 | 0.37 | 425 | 135 | 87 | 51 |
| | 18 | 0.28 | 450 | 140 | 85 | 45 |
| | 19 | 0.25 | 495 | 145 | 76 | 40 |
| | 20 | 0.27 | 465 | 140 | 85 | 43 |
| | 21 | 0.25 | 495 | 145 | 75 | 41 |

*IN REPRESENTATION OF EACH ELEMENT CONTENT, "—" INDICATES UNDER DETECTION LIMIT
**ANNEALING CONDITIONS WHEN MEASURING DECREASE IN HARDNESS: 600 DEG. C. × 1 MIN

Specifically, each copper alloy having the chemical component composition shown in Table 2 was melted in a coreless furnace, and an ingot-making was performed by a semi-continuous casting method, so that an ingot of 70 mm in thickness×200 mm in width×500 mm in length was prepared. The surface of each ingot was subjected to facing, Subsequently, the final annealing was performed under low-temperature conditions at 350° C. for 20 seconds, so that a copper alloy sheet of 0.15 mm in thickness corresponding to the thinning of lead frames was produced.

The rolling speeds and the hardness of the roll (shear hardness) in the final cold-rolling are shown in Table 2, respectively. In the final cold-rolling, a diameter of the roll used was set to 60 mm and the minimum reduction ratio per one pass was set to 25%.

In each copper alloy shown in Table 2, the remainder of the composition excluding the described elements was Cu. A total content of other impurity elements, Hf, Th, Li, Na, K, Sr, Pd, W, S, Si, C, Nb, Al, V, Y, Mo, Pb, In, Ga, Ge, As, Sb, Bi, Te, B, and misch metal was 0.1 mass % or less including the elements described in Table 2.

In the case where one or more elements selected from Mn, Mg, and Ca, were contained, a total content thereof was specified to be within the range of 0.0001 to 1.0 mass %. In the case where one or more elements selected from Zr, Ag, Cr, Cd, Be, Ti, Co, Ni, Au, and Pt, were contained, a total content was specified to be within the range of 0.001 to 1.0 mass %. Furthermore, the total content of all these elements was specified to be within the range of 1.0 mass % or less.

In each example, a specimen was cut out from the copper alloy sheet thus prepared, such that the properties of each specimen, such as the a texture, a tensile strength, a hardness, an electric conductivity, and a softening resistance or the like were evaluated. The results are shown in Table 2.

(Measurement of Texture)

In each copper alloy sheet specimen, the intensity of X-ray diffraction of (200) plane in the sheet surface and the X-ray diffraction intensity (I(220)) from the (220) plane, were measured by using an X-ray diffractometer (manufactured by Rigaku Corporation) through the use of Co as a target on condition that the tube voltage was 50 kV, the tube current 200 mA, the scanning speed 2°/min, the sampling width 0.02°, and the measurement range (2θ) 30° to 115°. From the two, the X-ray diffraction intensity ratio (I(200)/I(220)) was determined. Measurements were conducted at two points, and an average value thereof was taken as I(200)/I(220).

(Measurement of Hardness)

Measurements of a hardness of a copper alloy sheet specimen was conducted 4 points with a micro Vickers hardness tester by applying a load of 0.5 kg, and an average value thereof was taken as the hardness.

(Measurement of Electric Conductivity)

The copper alloy sheet specimen was processed into a slip-shaped test piece of 10 mm in width×300 mm in length by milling, and an electric resistance was measured with a double bridge resistance meter, and the electric conductivity was calculated by an average cross-sectional area method.

(Softening Resistance)

The softening resistance of each specimen was evaluated by a degree of the decrease in the hardness by an annealing. Specimens (10 mm in width×10 mm in length) for evaluating the hardness were appropriately taken from a product copper alloy sheet after subjected to the final cold-rolling and the final low-temperature annealing, and from a copper alloy sheet obtained by the product copper alloy sheet being annealed at 500° C. for 1 minute followed by water-cooled. Measurements of a hardness were conducted with a micro Vickers hardness tester (Product Name "Micro Vickers Hardness Tester" manufactured by MATSUZAWA CO., LTD) by applying a load of 0.5 kg.

As is clear in Table 2, Examples 1 to 14 of the present invention, copper alloys having compositions within the scope of the present invention, are produced by product methods performed on condition that a rolling speed and a hardness of the roll or the like in the final cold-rolling are within the preferable range. Accordingly, in each of Examples 1 to 14 of the present invention, a ratio (I(200)/I(220)) of the intensity of X-ray diffraction of (200) plane in the surface of the Cu—Fe—P alloy sheet to the X-ray diffraction intensity (I(220)) from the (220) plane in the surface thereof, are 0.3 or less.

As a result, each of Examples 1 to 14 of the present invention has a high strength with a tensile strength of 500 MPa or more and a hardness of 150 HV or more; and has a high softening resistance in which an amount of a decrease in the hardness after annealed at 500° C. for 1 minute is 30 Hv or less.

Contrary to that, in each of Comparative Examples 15 to 17, a rolling speed in the final cold-rolling is too small, or a hardness of the roll is too low, although it is a copper alloy sheet having a composition within the scope of the present invention. Accordingly, in each of Comparative Examples 15 to 17, the above-stated X-ray diffraction intensity ratio (I(200)/I(220)) greatly exceeds the upper limit of 0.3. Accordingly, a strength level is low and an amount of a decrease in the hardness after annealed at 500° C. for 1 minute exceeds 50 Hv, resulting in a remarkably decreased softening resistance.

In the copper alloy of Comparative Example 18, Fe content is 0.005%, and is out of the lower limit of 0.01%. On the other hand, the copper alloy sheet is produced by a production method performed on condition that the rolling speed and the hardness of the roll or the like in the final cold-trolling are in the preferable range. Accordingly, although the X-ray diffraction intensity ratio (I(200)/I(220)) is 0.3 or less, a strength level is low and an amount of a decrease in the hardness after annealed at 500° C. for 1 minute exceeds 40 Hv, resulting in a remarkably decreased softening resistance.

In the copper alloy of Comparative Example 19, although Fe content is 0.55%, and is out of the upper limit of 5.0%; however, the copper alloy is produced by a production method performed on condition that the final cold-rolling or the like are within the preferable ranges. Accordingly, the X-ray diffraction intensity ratio (I(200)/I(220)) is 0.3 or less, resulting in a remarkably decreased softening resistance and electric conductivity.

In the copper alloy of Comparative Example 20, P content is 0.005%, and is out of the lower limit of 0.01%; however, the copper alloy is produced by a production method performed on condition that the final cold-rolling or the like are within the preferable ranges. Accordingly, although the X-ray diffraction intensity ratio (I(200)/I(220)) is 0.3 or less, a strength level is low, and an amount of a decrease in hardness after annealed at 500° C. for 1 minute exceeds 40 Hv, resulting in a remarkably decreased softening resistance.

In the copper alloy of Comparative Example 21, P content is 0.17%, and is out of the upper limit of 0.15%, thereby cracks occurred in the sheet end portion during hot-rolled. However, the copper alloy is produced by a production method performed on condition that the final cold-rolling or the like are within the preferable ranges. Accordingly, the X-ray diffraction intensity ratio (I(200)/I(220)) is 0.3 or less, resulting in a remarkably decreased softening resistance and electric conductivity.

From these results, the importance of the items (described below) can be supported in order to provide both a high strength and a high softening resistance. The above issues are as follows: component composition of the copper alloy sheet according to the present invention; critical importance of the X-ray diffraction intensity ratio (I(200)/I(220)); and preferable production conditions to obtain such a microstructure.

(3)

In the Cu—Fe—P alloy sheet according to the present invention, the importance of each requirement for satisfying required properties used for a semiconductor lead frame or the like, and embodiments of the present invention will be described specifically below.

(Measurement of Orientation Distribution Density of B Orientation)

Measurement of the orientation distribution density of Brass orientation (B orientation) in the Cu—Fe—P alloy sheet according to the present invention, is conducted by the crystal orientation analysis method using an Electron Backscatter Diffraction Patterns made by an Field Emission Scanning Electron Microscope.

The reason why the crystal orientation analysis method using the above EBSP is specified as a method for measuring the texture of Brass orientation in a sheet in the present invention, is that a microstructure (texture) in a more microscopic region in a sheet (sheet surface) has an influence on the improvement of a resistance of peel off of the oxidation film. The crystal orientation analysis method using the above EBSP can quantify the texture in the microscopic region.

Contrary to that, the X-ray diffraction method (X-ray diffraction intensity, etc.) used widely for specifying or measuring a texture is meant to measure a microstructure (texture) in a relatively macroscopic region, as compared to the crystal orientation analysis method using the EBSP. Accordingly, the microstructure (texture) in the more microscopic region of a sheet cannot be properly measured by the X-ray diffraction method, in order to improve a resistance of peel off of the oxidation film.

According to the actual measurements and comparisons made by the present inventors, the orientation distribution density of B orientation measured by the crystal orientation analysis method using the EBSP, greatly differs from that measured by the X-ray diffraction method, even in the same sheet. Accordingly, in comparison of sheets having the orientation distribution density of B orientation different from one another, the results obtained from the above both measuring methods agree with each other in the whole group tendency (broad tendency) in which the orientation distribution densities of B orientation are extremely large or small; however, the order of the orientation distribution densities of B orientation in each sheet measured differs greatly from each other. Accordingly, as a result, the both measuring methods have no compatibility (correlativity) with each other.

In other words, the meaning of the present invention that a resistance of peel off of the oxidation film is influenced by the texture in a more microscopic region and the orientation distribution density of Brass orientation in the microscopic region is specified by the crystal orientation analysis method using the EBSP, can be understood from this fact.

(Measuring Method of Orientation Distribution Density of B Orientation)

The crystal orientation analysis method analyzes a crystal orientation based on the back scattering electron diffraction pattern (Kikuchi pattern) generated when an electron beam is applied to the sample surface aslant. The method is known for analyzing a crystal orientation of a diamond thin film and a copper alloy, as the high resolution crystal orientation analysis (FESEM/EBSP method). Examples in which a crystal orientation of a copper alloy is analyzed by this method as with the present invention are disclosed in Japanese Patent Laid-Open No. 2005-29857 and Japanese Patent Laid-Open No. 2005-139501 or the like.

The crystal orientation analysis method is performed in the following procedures: a region to be measured in a material is normally divided into regions having hexagonal shape or the like; and a Kikuchi pattern (B orientation mapping) is obtained by the reflected electron of an electron beam incident in the surface of each region thus divided. At the time, an orientation distribution in the specimen surface can be measured by scanning the electron beam in a two-dimensional manner over the specimen surface and by measuring a crystal orientation at a certain pitch.

Subsequently, a crystal orientation at the point where the electron beam is incident is known by analyzing the Kikuchi pattern thus obtained. That is, the crystal orientation at the point is obtained by comparing the obtained Kikuchi pattern to the data of known crystal structures. Similarly, the crystal orientation at the point adjacent to the measured point is determined, then it is assumed that, when an orientation difference between two crystal orientations that are adjacent to each other is $\pm 15°$ or less ($\pm 15°$ or less of dislocation from the crystal plane), the two crystal orientations are located at the same crystal plane. When an orientation difference between two crystal orientations is more than $\pm 15°$, the gap between them (the side or the like with which the both hexagonal shapes are in contact) is assumed to be a grain boundary. A grain boundary distribution in the specimen surface is determined in this manner.

More specifically, a specimen for observing a microstructure is taken out from the copper alloy sheet prepared. The specimen is subjected to the mechanical polishing, the buffing, and the electrolytic polishing such that the surface thereof is adjusted. In the specimen thus prepared, the orientation density of Brass orientation in a measured view is determined by determining whether each crystal grain is the orientation density of Brass orientation to be targeted (within 15° from the ideal orientation) using, for example, an FESE (manufactured by JEOL Ltd.) and an EBSP measurement and analysis system (OIM: Orientation Imaging Macrograph, manufactured by TexSEM Laboratories, Inc.)

The range of the measured view is a microscopic region of about 500 µm×500 µm, which is remarkably microscopic region as compared to the measured range in the X-ray diffraction method. Accordingly, measurement of an orientation density in a more microscopic microstructure in a sheet, which has an influence on a resistance of peel off of the oxidation film, can be performed in a more detailed and accurate manner as compared to the measurement of orientation density in the X-ray diffraction method, as stated above.

Because these orientation distributions vary in the direction of the sheet thickness, it is preferable that an orientation density is determined by averaging the orientation densities at several points taken appropriately along the direction of the sheet thickness. However, in the case of a copper alloy sheet used for a semiconductor material, e.g., a lead frame or the like, the sheet is a thin sheet of about 0.1 to 0.4 mm in thickness; hence, an orientation density measured in a true thickness can be used for evaluation.

(Meaning of Orientation Distribution Density)

As stated above, in the present invention, the development of a rolled texture is adjusted with respect to a specific orientation in order to acquire both a high strength and an excellent adhesion property with the oxide film in a Cu—Fe—P alloy sheet with small Fe content.

To realize this, the orientation distribution density of Brass orientation (B orientation) is enhanced (increased) in the present invention, such that a texture is developed so as to be 25% or more by measuring the crystal orientation analysis method using the above FESEM/EBSP. In the present invention, however, when an orientation difference between two crystal orientations that are adjacent to each other is ±15° or less (±15° or less of dislocation from the crystal plane), it is assumed that the two crystal orientations are located at the same crystal plane.

In a copper alloy sheet having a Cu—Fe—P based composition in which Fe content is small (0.5% or less), the orientation distribution density of B orientation has a large influence on a resistance of peel off of the oxidation film. As the orientation distribution density of B orientation is large, the rolled texture is more developed, leading to a high strength and an improved adhesion property with the oxide film.

Contrary to that, when the orientation distribution density of Brass orientation (B orientation) is less than 25%, the rolled texture is not developed in a Cu—Fe—P alloy sheet with small Fe content, resulting in a decreased strength and no-improved adhesion property with the oxide film.

(Average Grain Size)

In the present invention, an average grain size in a microstructure in a copper alloy sheet is specified as 6.0 μm or less by measuring with the crystal orientation analysis method using the FESEM/EBSP, as a prerequisite requirement for exhibiting the effect of controlling the above texture and the effect of the texture itself. By fining the average grain size to 6.0 μm or less, a resistance of peel off of the oxidation film is also improved, and the control for creating the above texture and the exhibition of the effect that the resistance of peel off between the texture and the oxide film is improved, are also easy. On the other hand, when the average grain size is more than 6.0 μm and the grain is coarse, the control for creating the above texture and the exhibition of the effect of the above texture itself are difficult.

The average grain size can be measured while measuring the orientation distribution density of B orientation by the crystal orientation analysis method using FESEM/EBSP, as stated above.

(Component Composition of Copper Alloy Sheet)

In the present invention, both a high strength and an excellent adhesion property with the oxide film are acquired for the use in a semiconductor lead frame or the like, in which a tensile strength is 500 MPa or more, a hardness is 150 Hv or more, and an electric conductivity is 50% IACS or more. To realize this, a Cu—Fe—P alloy sheet has a basic composition in which Fe content is 0.01 to 0.50%, P content is 0.01 to 0.15%, and the remainder is composed of Cu and inevitable impurities.

With respect to the basic composition, an aspect of the present invention may further contain either one or both of Zn and Sn within the following content. Also, other elements to be added optionally and impurities may be contained as long as these properties are not impaired. All of the contents of alloy elements and impurities are represented by mass %.

(Fe)

Fe is a major element that precipitates as Fe or a Fe-group intermetallic compound and increases a strength and a softening resistance of a copper alloy. When Fe content is less than 0.01%, the above precipitated particles is generated in a small amount in accordance with the production conditions; hence, contribution to the increase in the strength is insufficient, resulting in a decreased strength and a decreased softening resistance, while the improvement of the electric conductivity is satisfied. On the other hand, when Fe content exceeds 0.50%, an electric conductivity and an Ag plating property are deteriorated, as is in the conventional technique. When intending to increase a precipitation amount of the above precipitated particles in order to increase an electric conductivity forcedly, the precipitated particles are adversely too developed and coarse, thereby resulting in a decreased strength and a decreased softening resistance. Accordingly, Fe content should be within a relatively low range of 0.01 to 0.50%.

(P)

P is a major element with a function of forming a compound with Fe to increase a strength and a softening resistance of a copper alloy, in addition to a deoxidizing action. When P content is less than 0.01%, a precipitated compound is generated in a small amount in accordance with the production conditions, resulting in a failure to acquire a desired strength and softening resistance. On the other hand, when P content exceeds 0.15%, not only an electric conductivity but also a softening resistance, a hot workability and a stampability are deteriorated. Accordingly, P content should be within the range of 0.01 to 0.15%.

(Zn)

Zn improves a heat resistant peeling property of the solder of a copper alloy and the Sn plating, which are required of a lead frame, etc. When Zn content is less than 0.005%, a desired effect cannot be acquired. On the other hand, when Zn content exceeds 3.0%, not only a wettability but also a softening resistance and an electric conductivity are greatly deteriorated. Accordingly, Zn content should, when optionally contained, be selected within the range of 0.005 to 3.0% in accordance with (in consideration of) the balance between an electric conductivity and a heat resistant peeling property of the soldering and the Sn plating that are requested of an application.

(Sn)

Sn contributes to an increase in a strength of a copper alloy. When Sn content is less than 0.001%, it fails to contribute to the increase in a strength. On the other hand, when Sn content is large, the effect of Sn is saturated to conversely incur a decrease in an electric conductivity. Accordingly, Sn content should, when optionally contained, be selected within the range of 0.001 to 5.0% in accordance with (in consideration of) the balance between a strength (hardness) and an electric conductivity that are requested of an application.

(Contents of Mn, Mg, Ca)

Mn, Mg, and Ca contribute to an improvement of a hot workability of a copper alloy, hence, these elements are optionally contained when the effect is necessary. When a total content of one or more elements selected from Mn, Mg, and Ca is less than 0.0001%, a desired effect cannot be acquired. On the other hand, when a total content thereof exceeds 1.0%, not only a strength and a softening resistance of a copper alloy are decreased but also an electric conductivity is drastically decreased due to generation of coarse dispersoids and oxides. Accordingly, these elements should be optionally contained in a total content of 0.0001 to 1.0%.

(Contents of Zr, Ag, Cr, Cd, Be, Ti, Co, Ni, Au, Pt)

These elements are effective for increasing a strength of a copper alloy, hence, they are optionally contained when the effect is necessary. When a total content of one or more elements selected from these elements is less than 0.001%, a desired effect cannot be acquired. On the other hand, when a total content thereof exceeds 1.0%, it is not preferable because not only a strength and a softening resistance of a copper alloy are deteriorated but also an electric conductivity is drastically decreased due to generation of coarse dispersoids and oxides. Accordingly, these elements should be optionally contained in a total content of 0.001 to 1.0%.

When these elements are contained in conjunction with the above Mn, Mg, and Ca, a total content of these elements to be contained should be 1.0% or less.

(Contents of Hf, Th, Li, Na, K, Sr, Pd, W, S, Si, C, Nb, Al, V, Y, Mo, Pb, In, Ga, Ge, As, Sb, Bi, Te, B, Misch Metal)

These elements are impurity elements, and when a total content of these elements exceeds 0.1%, a strength and a softening resistance thereof are deteriorated due to generation of coarse dispersoids or oxides. Accordingly, a total content of these elements is preferably 0.1% or less.

(Production Condition)

Preferable production conditions for making a microstructure of a copper alloy sheet compatible with the above-described microstructure specified by the present invention, will be described below. The copper alloy sheet according to the present invention does not require the normal production process per se to be changed drastically and can be produced through the same process as the normal one, except preferable conditions, e.g., the final low-temperature annealing conditions to attain the above-described microstructure specified by the present invention in which the texture is controlled.

That is, a copper alloy melt adjusted so as to have the above-described preferable component composition is cast. The resulting ingot is subjected to facing, and to a heat treatment or a homogenization heat treatment. Thereafter, a hot-rolling is performed, and a hot-rolled sheet is water-cooled. The hot-rolling may be performed under the usual conditions.

Subsequently, a primary cold-rolling referred to as an intermediate rolling is performed, followed by an annealing and a cleaning. Furthermore, the finish (final) cold rolling and a low-temperature annealing (final annealing, finish annealing) are performed, so that a copper alloy sheet and the like having a product sheet thickness is produced. These annealing and cold-rolling may be performed repeatedly. For example, when the copper alloy sheet is used for a semiconductor material, e.g., a lead frame, a product sheet thickness is about 0.1 to 0.4 mm.

A solution treatment and a quenching treatment by water-cooling of the copper alloy sheet may be performed before the primary cold-rolling. At this time, a solution treatment temperature is selected within the range of 750 to 1000° C., for example.

(Final Cold-Rolling)

The final cold-rolling is also performed in the usual method. However, in order to provide the increased softening resistance to a lead frame such that a strength thereof is less decreased in the heat treatment (stress relief annealing) after subjected to the stamping process, it is preferable that a rolling speed in the final cold-rolling is large, or a hardness (shear hardness) of the roll in the final cold-rolling is increased. That is, a copper alloy sheet is cold-rolled in the final cold-rolling by using the measures selected from: a rolling speed of 200 m/min or more; and 60 Hv or more of a hardness (shear hardness) of the roll. Alternatively, a copper alloy sheet is cold-rolled in combination of these measures.

Also, in order to improve a stampability at stamping, an amount of a deformation introduced in the final cold-rolling, is made large. That is, a copper alloy sheet is cold-rolled in the final cold-rolling by using the measures selected from: use of a roll having a small diameter of less than 80 mm$\phi$, a minimum rolling reduction per one pass of 20% or more, and the use of a roll having a length (roll width) of 500 mm or more. Alternatively, a copper alloy sheet is cold-rolled in combination of these measures.

Preferably, the number of passes of the final cold-rolling is usually set at 3 to 4 times to prevent the number of passes from becoming too small or too large. A reduction ratio exceeding 50% per one pass is not necessary, and each reduction ratio per one pass is determined in consideration of an original sheet thickness, a final sheet thickness after cold-rolled, the number of passes, and the maximum reduction ratio.

(Final Annealing)

In the present invention, it is preferable that a low-temperature final annealing is performed in a continuous heat treatment furnace after the final cold-rolling. The final annealing in the continuous heat treatment furnace is preferably performed under low-temperature conditions of 100 to 400° C. for 0.2 minutes or more to 300 minutes or less. In a usual method for producing a copper alloy sheet used for a lead frame, the final annealing is not performed after the final cold-rolling in order to avoid a decrease in strength, except an annealing for relieving a stress (350° C. for about 20 seconds). However, in the present invention, the decrease in strength can be suppressed by the above-described cold-rolling conditions and by a lowered temperature in the final annealing. When the final annealing is performed at a low-temperature, a stampability is improved.

Under the conditions that the annealing temperature is lower than 100° C., the annealing time is less than 0.2 minutes, or this low-temperature annealing is not performed, there is a high probability that a microstructure and properties of a copper alloy sheet are hardly changed from the state after the final cold-rolling. Conversely, when the annealing is performed at a temperature exceeding 400° C. or the annealing is performed for more than 300 minutes, the recrystallization occurs, the rearrangement and the recovery phenomena of the dislocation occur excessively, and the precipitates become coarse; therefore, there is a high probability that a stampability and a strength are decreased.

(Control of Texture and Average Grain Size in Final Annealing)

In addition to that, the texture and the average grain size specified by the present invention can be obtained by performing the final annealing in a continuous heat treatment furnace, leading to an increased strength and an improved adhesion property with the oxide film. That is, a tensile force loaded on a sheet at threading and a threading speed can be controlled in a continuous heat treatment furnace, thereby, allowing the rolled texture in which the orientation distribution density of Brass orientation (B orientation) is 25% or more, to be developed. Also, an average grain size can be fined so as to be 6.0 µm or less. The tensile force loaded on a sheet at threading and the threading speed in a continuous heat treatment furnace have great influences on the orientation distribution density of Brass (B orientation) and the average grain size.

In order to obtain the texture and the average grain size specified by the present invention, a tensile force at threading in the final annealing performed by using a continuous heat treatment furnace is selected from the range of 0.1 to 8 kgf/mm2, and a threading speed is controlled so as to be within the range of 10 to 100 m/min. When either one or both of a tensile force and a threading speed at threading are out of these ranges, there is a high probability that the texture and the average grain size specified by the present invention cannot be obtained.

Example 3

Examples of the present invention will be described below. Copper alloy thin sheets having various orientation distribution densities of Brass orientation and average grain sizes were produced by changing a tensile force at threading and a threading speed in the final annealing performed by using a continuous heat treatment furnace. Subsequently, properties, e.g., a tensile strength, a hardness and an electric conductivity, and a resistance of peel off of the oxidation film (peeling temperature of the oxide film) of the each copper alloy thin sheet were evaluated. The results of the evaluations are shown in Table 3.

prepared. The surface of each ingot was subjected to facing, followed by heating. Thereafter, the hot-rolling was performed at a temperature of 950° C. to prepare a sheet of 16 mm in thickness, and the resulting sheet was quenched in water from a temperature of 750° C. or more. The oxidized scale was removed and, thereafter, the primary cold-rolling (intermediate rolling) was performed. The resulting sheet was subjected to facing and, thereafter, the final cold-rolling was performed in which 4 passes of the cold-rolling were

TABLE 3

| CLASSIFICATION | ALLOY NO. | CHEMICAL COMPONENT COMPOSITION OF COPPER ALLOY SHEET (REMAINDER: Cu AND IMPURITIES) | | | | | FINISH LOW-TEMPERATURE ANNEALING | |
|---|---|---|---|---|---|---|---|---|
| | | Fe | P | Zn | Sn | OTHERS | TENSILE FORCE AT THREADING kgf/mm$^2$ | THREADING SPEED m/min |
| EXAMPLES OF INVENTION | 1 | 0.25 | 0.080 | 1.2 | 0.019 | — | 4 | 50 |
| | 2 | 0.28 | 0.098 | 0.31 | 2.0 | — | 4 | 50 |
| | 3 | 0.16 | 0.058 | 0.050 | 0.021 | — | 3 | 60 |
| | 4 | 0.17 | 0.055 | 0.050 | 0.095 | — | 3 | 50 |
| | 5 | 0.16 | 0.057 | 0.049 | 0.50 | — | 5 | 70 |
| | 6 | 0.04 | 0.080 | — | — | — | 1 | 70 |
| | 7 | 0.47 | 0.080 | — | — | — | 7 | 40 |
| | 8 | 0.27 | 0.025 | — | — | — | 3 | 90 |
| | 9 | 0.26 | 0.13 | — | — | — | 5 | 30 |
| | 10 | 0.26 | 0.080 | 0.25 | 0.019 | Mn: 0.003 | 3 | 60 |
| | 11 | 0.26 | 0.080 | 0.25 | 0.019 | Ca: 0.002, Ti: 0.005 | 3 | 60 |
| | 12 | 0.26 | 0.080 | 0.25 | 0.019 | Mn: 0.003, Ni: 0.01, Al: 0.001 | 3 | 60 |
| | 13 | 0.26 | 0.080 | 0.25 | 0.019 | Mg: 0.003, Ag: 0.1 | 3 | 60 |
| | 14 | 0.26 | 0.080 | 0.25 | 0.019 | Ca: 0.002, Zr: 0.005 | 3 | 60 |
| COMPARATIVE EXAMPLES | 15 | 0.11 | 0.037 | 0.022 | 0.012 | — | 0 | 5 |
| | 16 | 0.10 | 0.034 | 0.022 | 0.012 | — | 2 | 120 |
| | 17 | 0.11 | 0.033 | 0.015 | 0.005 | — | 10 | 60 |
| | 18 | 0.007 | 0.084 | 0.25 | 0.019 | — | 3 | 60 |
| | 19 | 0.58 | 0.090 | 0.25 | 0.019 | — | 3 | 60 |
| | 20 | 0.27 | 0.008 | 0.25 | 0.019 | — | 3 | 60 |
| | 21 | 0.26 | 0.16 | 0.25 | 0.019 | — | 3 | 60 |

| CLASSIFICATION | ALLOY NO. | MICROSTRUCTURE OF COPPER ALLOY SHEET | | PROPERTIES OF COPPER ALLOY SHEET | | | OXIDE FILM |
|---|---|---|---|---|---|---|---|
| | | Brass ORIENTATION DENSITY % | AVERAGE GRAIN SIZE μm | TENSILE STRENGTH MPa | HARDNESS Hv | ELECTRIC CONDUCTIVITY % IACS | PEELING TEMPERATURE ° C. |
| EXAMPLES OF INVENTION | 1 | 48 | 5.3 | 565 | 170 | 74 | 400 |
| | 2 | 50 | 2.8 | 765 | 235 | 34 | 410 |
| | 3 | 41 | 4.9 | 545 | 160 | 84 | 370 |
| | 4 | 45 | 4.5 | 575 | 170 | 79 | 400 |
| | 5 | 40 | 3.6 | 650 | 195 | 59 | 380 |
| | 6 | 28 | 5.7 | 515 | 155 | 86 | 350 |
| | 7 | 35 | 5.1 | 585 | 175 | 80 | 360 |
| | 8 | 32 | 4.6 | 520 | 155 | 86 | 360 |
| | 9 | 37 | 5.4 | 555 | 165 | 83 | 370 |
| | 10 | 40 | 4.9 | 545 | 160 | 82 | 370 |
| | 11 | 41 | 4.8 | 555 | 165 | 81 | 370 |
| | 12 | 42 | 4.8 | 570 | 170 | 81 | 380 |
| | 13 | 43 | 4.7 | 590 | 175 | 78 | 390 |
| | 14 | 41 | 4.9 | 555 | 165 | 82 | 370 |
| COMPARATIVE EXAMPLES | 15 | 11 | 8.6 | 420 | 130 | 88 | 300 |
| | 16 | 21 | 6.6 | 435 | 135 | 87 | 330 |
| | 17 | 18 | 7.2 | 430 | 135 | 88 | 320 |
| | 18 | 39 | 5.1 | 455 | 140 | 84 | 320 |
| | 19 | 40 | 4.7 | 490 | 150 | 76 | 360 |
| | 20 | 40 | 4.9 | 465 | 145 | 83 | 330 |
| | 21 | 40 | 4.8 | 480 | 145 | 77 | 360 |

*IN REPRESENTATION OF EACH ELEMENT CONTENT, "—" INDICATES UNDER DETECTION LIMIT

Specifically, each copper alloy having the chemical component composition shown in Table 3 was melted in a coreless furnace, and an ingot-making was performed by a semi-continuous casting method, so that an ingot of 70 mm in thickness×200 mm in width×500 mm in length was prepared. The surface of each ingot was subjected to facing, followed by heating. Thereafter, the hot-rolling was performed with the intermediate annealing therebetween. Subsequently, the final annealing was performed at an ambient temperature in a furnace of 450° C., so that a copper alloy sheet of 0.15 mm in thickness corresponding to the thinning of lead frames was produced.

In the final cold-rolling, a rolling speed was set to 300 m/min, a hardness (shear hardness) of the roll to 90 Hs, a diameter of the roll used to 60 mmϕ, and a minimum reduction ratio per one pass to 10%.

Each tensile force (kgf/mm$^2$) at threading and each threading speed (m/min) in the final annealing performed by using a continuous heat treatment furnace, were shown in Table 3.

In each copper alloy shown in Table 3, the remainder of the composition excluding the described elements was Cu. A total content of other impurity elements, Hf, Th, Li, Na, K, Sr, Pd, W, S, Si, C, Nb, Al, V, Y, Mo, Pb, In, Ga, Ge, As, Sb, Bi, Te, B, and misch metal was 0.1 mass % or less including the elements described in Table 3.

In the case where one or more elements selected from Mn, Mg, and Ca, were contained, a total content thereof was specified to be within the range of 0.0001 to 1.0 mass %. In the case where one or more elements selected from Zr, Ag, Cr, Cd, Be, Ti, Co, Ni, Au, and Pt were contained, a total content was specified to be within the range of 0.001 to 1.0 mass %. Furthermore, the total content of all these elements was specified to be within the range of 1.0 mass % or less.

In each example, a specimen was cut out from the copper alloy sheet thus prepared, such that the properties of each specimen such as a texture, a tensile strength, a hardness, an electric conductivity, and a resistance of peel off of the oxidation film or the like, were evaluated. The results are shown in Table 3.

(Measurement of Texture)

A specimen for observing a microstructure was taken out from the copper alloys sheet thus prepared. The specimen was subjected to a mechanical polishing, a buffing, and an electrolytic polishing such that the surface thereof was adjusted. In the specimen thus prepared, the orientation distribution density of Brass orientation (B orientation) in a region of 500 μm×500 μm was measured at 1 μm pitch by the above-described method.

Measurement and analysis were conducted using an FESE (manufactured by JEOL Ltd.) and the same analysis system as the EBSP measurement and analysis system (manufactured by TexSEM Laboratories, Inc.)

(Measurement of Hardness)

A specimen of 10×10 mm was cut out from the copper alloy sheet thus prepared. Measurement of hardness was conducted at 4 points with a micro Vickers hardness tester (Product Name: "Micro Vickers Hardness Tester" manufactured by MATSUZAWA CO., LTD) by applying a load of 0.5 kg, and an average value thereof was taken as the hardness.

(Measurement of Electric Conductivity)

The copper alloy sheet specimen was processed into a slip-shaped test piece of 10 mm in width×300 mm in length by milling, and an electric resistance was measured with a double bridge resistance meter, and the electric conductivity was calculated by an average cross-sectional area method.

(Adhesion Property with Oxide Film)

A resistance of peel off of the oxidation film of each specimen was evaluated by a critical temperature at which the oxide film is peeled using a tape peeling test. The tape peeling test was conducted as follows: a specimen of 10×30 mm was cut out from the copper alloy sheet thus prepared; the specimen was heated at a certain temperature in the air for 5 minutes; and a commercially available tape (Product Name: Mending Tape manufactured by Sumitomo 3M Limited) was applied to the surface of the specimen where an oxide film was generated, then the tape was peeled off. When a heating temperature was increased at intervals of 10° C., the lowest temperature at which the oxide film was peeled was determined and taken as an oxide film peeling temperature.

As is clear in Table 3, Examples 1 to 14 of the present invention, copper alloys having compositions within the scope of the present invention, are produced by production methods performed on condition that a tensile force at threading and a threading speed in the final annealing performed by using a continuous heat treatment furnace are within the preferable ranges. Accordingly, Examples 1 to 14 of the present invention have a microstructure in which the orientation distribution density of Brass orientation is 25% or more by the above measuring method, and have a fined crystal grain of which average grain size is 6.0 μm or less.

As a result, each of Examples 1 to 14 of the present invention has a high strength with a tensile strength of 500 MPa or more and a hardness of 150 Hv or more, and an excellent adhesion property with the oxide film in which an oxide film peeling temperature is 350° C. or more. Accordingly, each of Examples 1 to 14 of the present invention as a semiconductor base material has, when assembling a semiconductor package, a good adhesion property between a resin and a die pad, leading to a package with high reliability.

Contrary to that, in each of Comparative Examples 15 to 17, either one or both of a tensile force at threading and a threading speed are out of the preferable ranges, although it is a copper alloy having a composition within the scope of the present invention. Accordingly, in each of Comparative Examples 15 to 17, not only the orientation distribution density of Brass orientation is less than 25% when measured by the above-stated measuring method, but also the crystal grains are coarse with an average grain size of more than 6.0 μm. As a result, in each of Comparative Examples 15 to 17, a strength level is low, an oxide film peeling temperature is 330° C. or less, and a resistance of peel off of the oxidation film is remarkably deteriorated.

In the copper alloy of Comparative Example 18, Fe content is 0.007%, and is out of the lower limit of 0.01%. On the other hand, the copper alloy is produced by a production method performed on condition that a tensile force at threading and a threading speed in the final annealing performed by using a continuous heat treatment furnace are within the preferable ranges. Accordingly, the copper alloy has a microstructure in which the orientation distribution density of Brass orientation is 25% or more, has fined crystal grains with an average grain size of 6.0 μm or less, and has an excellent adhesion property with the oxide film; however, has a low level of strength.

In the copper alloy of Comparative Example 19, Fe content is 0.58%, and is out of the upper limit of 5.0%. On the other hand, the copper alloy is produced by a production method performed on condition that a tensile force at threading and a threading speed in the final annealing performed by using a continuous heat treatment furnace are within the preferable conditions. Accordingly, the copper alloy has a microstructure in which the orientation distribution density of Brass orientation is 25% or more, has fined crystal grains with an average grain size of 6.0 μm or less, and has an excellent adhesion property with the oxide film; however, has a remarkably decreased electric conductivity.

In the copper alloy of Comparative Example 20, P content is 0.008%, and is out of the lower limit of 0.01%. On the other hand, the copper alloy is produced by a production method performed on condition that a tensile force at threading and a threading speed in the final annealing performed by using a continuous heat treatment furnace are within the preferable ranges. Accordingly, the copper alloy has a microstructure in which the orientation distribution density of Brass orientation is 25% or more, has fined crystal grains with an average grain size of 6.0 µm or less, and has an excellent adhesion property with the oxide film; however, has a low level of strength.

In the copper alloy of Comparative Example 21, P content is 0.16%, and is out of the upper limit of 0.15%, thereby cracks occurred in the sheet end portion during hot-rolled. On the other hand, the copper alloy is produced by a production method performed on condition that a tensile force at threading and a threading speed in the final annealing performed by using a continuous heat treatment furnace are within the preferable ranges. Accordingly, the copper alloy has a microstructure in which the orientation distribution density of Brass orientation is 25% or more, has fined crystal grains with an average grain size of 6.0 µm or less, and has an excellent adhesion property with the oxide film; however, has a remarkably decreased electric conductivity.

From the above results, the importance of the following items can be supported in order to provide both a high strength and a high softening resistance. The issues are as follows: component composition of the copper alloy sheet according to the present invention; critical importance of the specified texture, and preferable production conditions to obtain such a microstructure.

INDUSTRIAL APPLICABILITY

As stated above, according to the present invention, a Cu—Fe—P alloy sheet having a high strength and an excellent stampability in which these properties are compatible with each other, can be provided.

In addition, according to the present invention, a Cu—Fe—P alloy sheet having a high strength and a high softening resistance in which these properties are compatible with each other, can be provided.

In addition, according to the present invention, a Cu—Fe—P alloy sheet having a high strength and an excellent resistance of peel off of an oxidation film in which these properties are compatible with each other, can be provided. As a result, a semiconductor base material in which a resistance of peel off between a resin and a die pad is increased when assembling a semiconductor package, and the package has a high reliability, can be provided. As a result, the copper alloy sheet according to the present invention is applicable as a material for electric and electronic parts that are miniaturized and lightweight, to applications required for a high strength and a strict bending workability, such as lead frame, connector, terminal, switch, relay; applications requested for a softening resistance; and applications requested for an resistance of peel off of an oxidation film, i.e., a package-reliability; as well as lead frame for semiconductor device.

The invention claimed is:

1. A copper alloy sheet, comprising:
   Cu;
   0.01 to 0.50 mass % Fe;
   0.005 to 5.0 mass % Sn; and
   0.01 to 0.15 mass % P,
   wherein the copper alloy sheet has an improved stampability and which has a microstructure in which a value obtained by dividing the half-value-width of the intensity of diffraction of {311} plane in the sheet surface, by its peak height, is 0.015 or more.

2. The copper alloy sheet of claim 1, further comprising: 0.005 to 3.0 mass % Zn.

3. A copper alloy sheet for an electric and electronic part comprising:
   Cu;
   0.01 to 0.50 mass % Fe;
   0.005 to 5.0 mass % Sn; and
   0.01 to 0.15 mass % P,
   wherein the copper alloy sheet has an improved softening resistance and which has a microstructure in which a ratio (I(200)/I(220)) of the intensity (I(200)) of diffraction of the (200) plane in the sheet surface, to intensity (I(220)) of diffraction of the (220) plane, is 0.3 or less.

4. The copper alloy sheet of claim 3, further comprising: 0.005 to 3.0 mass % Zn.

5. A copper alloy sheet, comprising:
   Cu;
   0.01 to 0.50 mass % Fe;
   0.005 to 5.0 mass % Sn; and
   0.01 to 0.15 mass % P,
   wherein the copper alloy sheet has an improved resistance of peel off of an oxidation film and has a texture such that that two crystals adjacent with each other having an orientation difference between them of 15° or less are viewed that they are located in the same crystal plane, the orientation distribution density from Brass orientation measured by the crystal orientation analysis method using an Electron Backscatter Diffraction Pattern (EBSP) obtained by an Field Emission Scanning Electron Microscope (FE-SEM), is 25% or more.

6. The copper alloy of claim 5, wherein an average grain size of the copper alloy is 6.0 µm or less.

7. The copper alloy sheet of claim 6, further comprising: 0.005 to 3.0 mass % Zn.

8. The copper alloy sheet of claim 1 having a tensile strength of 500 MPa or more and a hardness of 150 Hv or more.

9. The copper alloy sheet of claim 1, further comprising one or more selected from the group consisting of A, B, C, and D:
   A: a total content of 0.0001 to 1.0 mass % of one or more elements selected from the group consisting of Mn, Mg, and Ca;
   B: a total content of 0.001 to 1.0 mass % of one or more elements selected from the group consisting of Zr, Ag, Cr, Cd, Be, Ti, Co, Ni, Au, and Pt;
   C: a total content of 0.0001 to 1.0 mass % of one or more elements selected from the group consisting of Mn, Mg, and Ca, and a total content of 0.001 to 1.0 mass % of one or more elements selected from the group consisting of Zr, Ag, Cr, Cd, Be, Ti, Co, Ni, Au, and Pt, respectively, wherein a total content of these elements is 1.0 mass % or less; and
   D: a total content of 0.1 mass % or less of Hf, Th, Li, Na, K, Sr, Pd, W, S, Si, C, Nb, Al, V, Y, Mo, Pb, In, Ga, Ge, As, Sb, Bi, Te, B, and misch metal.

10. The copper alloy sheet of claim 3, having a tensile strength of 500 MPa or more and a hardness of 150 Hv or more.

11. The copper alloy sheet of claim 5, having a tensile strength of 500 MPa or more and a hardness of 150 Hv or more.

12. The copper alloy sheet of claim 3, further comprising one or more selected from the group consisting of A, B, C, and D:
   A: a total content of 0.0001 to 1.0 mass % of one or more elements selected from the group consisting of Mn, Mg, and Ca;

B: a total content of 0.001 to 1.0 mass % of one or more elements selected from the group consisting of Zr, Ag, Cr, Cd, Be, Ti, Co, Ni, Au, and Pt;

C: a total content of 0.0001 to 1.0 mass % of one or more elements selected from the group consisting of Mn, Mg, and Ca, and a total content of 0.001 to 1.0 mass % of one or more elements selected from the group consisting of Zr, Ag, Cr, Cd, Be, Ti, Co, Ni, Au, and Pt, respectively, wherein a total content of these elements is 1.0 mass % or less; and D: a total content of 0.1 mass % or less of Hf, Th, Li, Na, K, Sr, Pd, W, S, Si, C, Nb, Al, V, Y, Mo, Pb, In, Ga, Ge, As, Sb, Bi, Te, B, and misch metal.

13. The copper alloy sheet of claim 5, further comprising one or more selected from the group consisting of A, B, C, and D:

A: a total content of 0.0001 to 1.0 mass % of one or more elements selected from the group consisting of Mn, Mg, and Ca;

B: a total content of 0.001 to 1.0 mass % of one or more elements selected from the group consisting of Zr, Ag, Cr, Cd, Be, Ti, Co, Ni, Au, and Pt;

C: a total content of 0.0001 to 1.0 mass % of one or more elements selected from the group consisting of Mn, Mg, and Ca, and a total content of 0.001 to 1.0 mass % of one or more elements selected from the group consisting of Zr, Ag, Cr, Cd, Be, Ti, Co, Ni, Au, and Pt, respectively, wherein a total content of these elements is 1.0 mass % or less; and D: a total content of 0.1 mass % or less of Hf, Th, Li, Na, K, Sr, Pd, W, S, Si, C, Nb, Al, V, Y, Mo, Pb, In, Ga, Ge, As, Sb, Bi, Te, B, and misch metal.

14. The copper alloy sheet of claim 3, wherein the copper alloy sheet has an improved softening resistance which is provided by a microstructure in which a ratio ($I(200)/I(220)$) of the intensity ($I(200)$) of diffraction of the (200) plane in a surface of the sheet, to the intensity ($I(220)$) of diffraction of the (220) plane, is 0.25 or less.

15. The copper alloy sheet of claim 1, comprising 0.01 to 0.0061 mass % P.

16. The copper alloy sheet of claim 3, comprising 0.01 to 0.0061 mass % P.

17. The copper alloy sheet of claim 5, comprising 0.01 to 0.0061 mass % P.

18. The copper alloy sheet of claim 1, having a tensile strength of at least 520 MPa.

19. The copper alloy sheet of claim 3, having a tensile strength of at least 520 MPa.

20. The copper alloy sheet of claim 5, having a tensile strength of at least 520 MPa.

* * * * *